US010804915B2

(12) United States Patent
Maki et al.

(10) Patent No.: US 10,804,915 B2
(45) Date of Patent: Oct. 13, 2020

(54) ATOMIC OSCILLATOR AND FREQUENCY SIGNAL GENERATION SYSTEM

(71) Applicant: SEIKO EPSON CORPORATION, Tokyo (JP)

(72) Inventors: Yoshiyuki Maki, Suwa (JP); Hiroyuki Yoshida, Izumo (JP); Noriaki Tanaka, Chino (JP); Noritaka Ide, Shiojiri (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 16/531,585

(22) Filed: Aug. 5, 2019

(65) Prior Publication Data
US 2020/0044658 A1 Feb. 6, 2020

(30) Foreign Application Priority Data

Aug. 6, 2018 (JP) .................. 2018-147805

(51) Int. Cl.
H03L 7/26 (2006.01)
H03L 1/02 (2006.01)
H03B 17/00 (2006.01)
G04F 5/14 (2006.01)

(52) U.S. Cl.
CPC .............. H03L 7/26 (2013.01); G04F 5/145 (2013.01); H03B 17/00 (2013.01); H03L 1/02 (2013.01)

(58) Field of Classification Search
CPC ... H03L 7/26; H03L 1/02; H03L 1/022; G04F 5/14; G04F 5/145; H03B 17/00
See application file for complete search history.

(56) References Cited

U.S. PATENT DOCUMENTS

| 2010/0188081 | A1 | 7/2010 | Lammegger |
| 2016/0218727 | A1 | 7/2016 | Maki |
| 2019/0097643 | A1* | 3/2019 | Nishida ..................... H03L 7/26 |
| 2019/0305515 | A1* | 10/2019 | Hagino .................. H03B 17/00 |

FOREIGN PATENT DOCUMENTS

| JP | H01-238083 A | 9/1989 |
| JP | H07-193499 A | 7/1995 |
| JP | 2001-007437 A | 1/2001 |
| JP | 2016-092146 A | 5/2016 |

OTHER PUBLICATIONS

Gerginov, Vladislav, et al. "Atom-based stabilization for laser-pumped atomic clocks." Proceedings of the 20th European Frequency and Time Forum. IEEE, 2006. (Year: 2006).*

* cited by examiner

Primary Examiner — Ryan Johnson
(74) Attorney, Agent, or Firm — Oliff PLC

(57) ABSTRACT

An atomic oscillator includes: a light emitting element; a temperature control element that controls a temperature of the light emitting element; an atomic cell which is irradiated with a light from the light emitting element and in which an alkali metal atom is contained; a light detection element that detects a light transmitted through the atomic cell; an oscillator that outputs an oscillation signal; a wave detection circuit that detects a wave of a signal, which is based on an output of the light detection element, using the oscillation signal of the oscillator, and outputs a wave detection signal; and a drive circuit that includes a constant current circuit generating a current of a specified value for driving the light emitting element and superimposes a modulation current, which is based on the oscillation signal of the oscillator, on the current to output a drive current to the light emitting element.

5 Claims, 14 Drawing Sheets

ATOMIC OSCILLATOR AND FREQUENCY SIGNAL GENERATION SYSTEM

The present application is based on, and claims priority from JP Application Serial Number 2018-147805, filed Aug. 6, 2018, the disclosure of which is hereby incorporated by reference herein in its entirety.

BACKGROUND

1. Technical Field

The present disclosure relates to an atomic oscillator and a frequency signal generation system.

2. Related Art

In recent years, an atomic oscillator using a coherent population trapping (CPT) phenomenon, which is one of quantum interference effects, has been proposed. The atomic oscillator using the CPT phenomenon is an oscillator that utilizes an electromagnetically induced transparency (EIT) in which absorption of a coherent light is stopped when alkali metal atoms are irradiated with the coherent light having two different wavelengths. In the atomic oscillator using the CPT phenomenon, it is necessary to control a wavelength of light emitted from a light source with high accuracy.

As a method of controlling the wavelength of light, for example, it is conceivable to change a bias current supplied to the light source so that a light emitting wavelength becomes constant. However, since a light quantity of the light source also changes according to a change of the bias current, a light shift is caused and frequency stability is lowered.

For example, in JP-A-2001-7437, it is described that an operation temperature is changed so as to compensate for a drift of an oscillation frequency so that a specified oscillation frequency can be obtained at a central operation current in a set range when an operation current reaches a limit of a set range due to the drift of the oscillation frequency. By applying a technique described in JP-A-2001-7437 to the atomic oscillator, the operation current can be kept within the set range, so that the light shift can be reduced.

JP-A-2001-7437 is an example of the related art.

However, in JP-A-2001-7437, when the operating current reaches the limit, the operation temperature is changed and the operation current is set to a central value of the set range, so there is a possibility that the operation current value fluctuates rapidly in a short time or becomes discontinuous. Then, the wavelength of the semiconductor laser may fluctuate rapidly, and when the technique described in JP-A-2001-7437 is applied to an atomic oscillator, the oscillation frequency of the atomic oscillator may fluctuate rapidly to lower the frequency stability.

SUMMARY

An atomic oscillator according to an aspect of the present disclosure includes a light emitting element, a temperature control element that controls a temperature of the light emitting element, an atomic cell which is irradiated with a light from the light emitting element and in which an alkali metal atom is contained, a light detection element that detects a light transmitted through the atomic cell, an oscillator that outputs an oscillation signal, a wave detection circuit that detects a wave of a signal, which is based on an output of the light detection element, using the oscillation signal of the oscillator, and outputs a wave detection signal, a temperature control circuit that controls the temperature control element based on the wave detection signal, and a drive circuit that includes a constant current circuit generating a current of a specified value for driving the light emitting element and superimposes a modulation current, which is based on the oscillation signal of the oscillator, on the current to output the resultant current to the light emitting element.

In the atomic oscillator, the wave detection signal may not be input to the constant current circuit.

In the atomic oscillator, the temperature control circuit may control the temperature of the light emitting element to a temperature at which the light emitting element emits a light of a wavelength used for a detection of an electromagnetically induced transparency (EIT) signal.

The atomic oscillator may further include a temperature detection element that detects the temperature of the light emitting element, and the temperature control circuit may control the temperature of the light emitting element to the temperature at which the light emitting element emits a light of a wavelength used for the detection of the EIT signal using an output of the temperature detection element.

In the atomic oscillator, a speed at which the temperature control circuit controls the temperature control element based on the output of the temperature detection element, may be higher than a speed at which the temperature control circuit controls the temperature control element based on the wave detection signal.

A frequency signal generation system includes an atomic oscillator, and a terminal to which a frequency signal from the atomic oscillator is input, in which the atomic oscillator includes a light emitting element that emits alight, a temperature control element that controls a temperature of the light emitting element, an atomic cell that contains an alkali metal atom, a light detection element that detects a light transmitted through the atomic cell, an oscillator that outputs an oscillation signal, a wave detection circuit that detects a wave of a signal, which is based on an output of the light detection element, using the oscillation signal of the oscillator, and outputs a wave detection signal, a temperature control circuit that controls the temperature control element based on the wave detection signal, and a drive circuit that includes a constant current circuit generating a current of a specified value for driving the light emitting element and superimposes a modulation current, which is based on the oscillation signal of the oscillator, on the current to output the resultant current to the light emitting element.

DESCRIPTION OF EXEMPLARY EMBODIMENTS

Hereinafter, a preferred embodiment will be described in detail with reference to the drawings. Note that the embodiments described below do not unduly limit the contents of the present disclosure described in the appended claims. Also, not all of the configurations described below are necessarily essential components of the present disclosure.

1. Atomic Oscillator 1.1. Configuration of Atomic Oscillator

Figure 1:
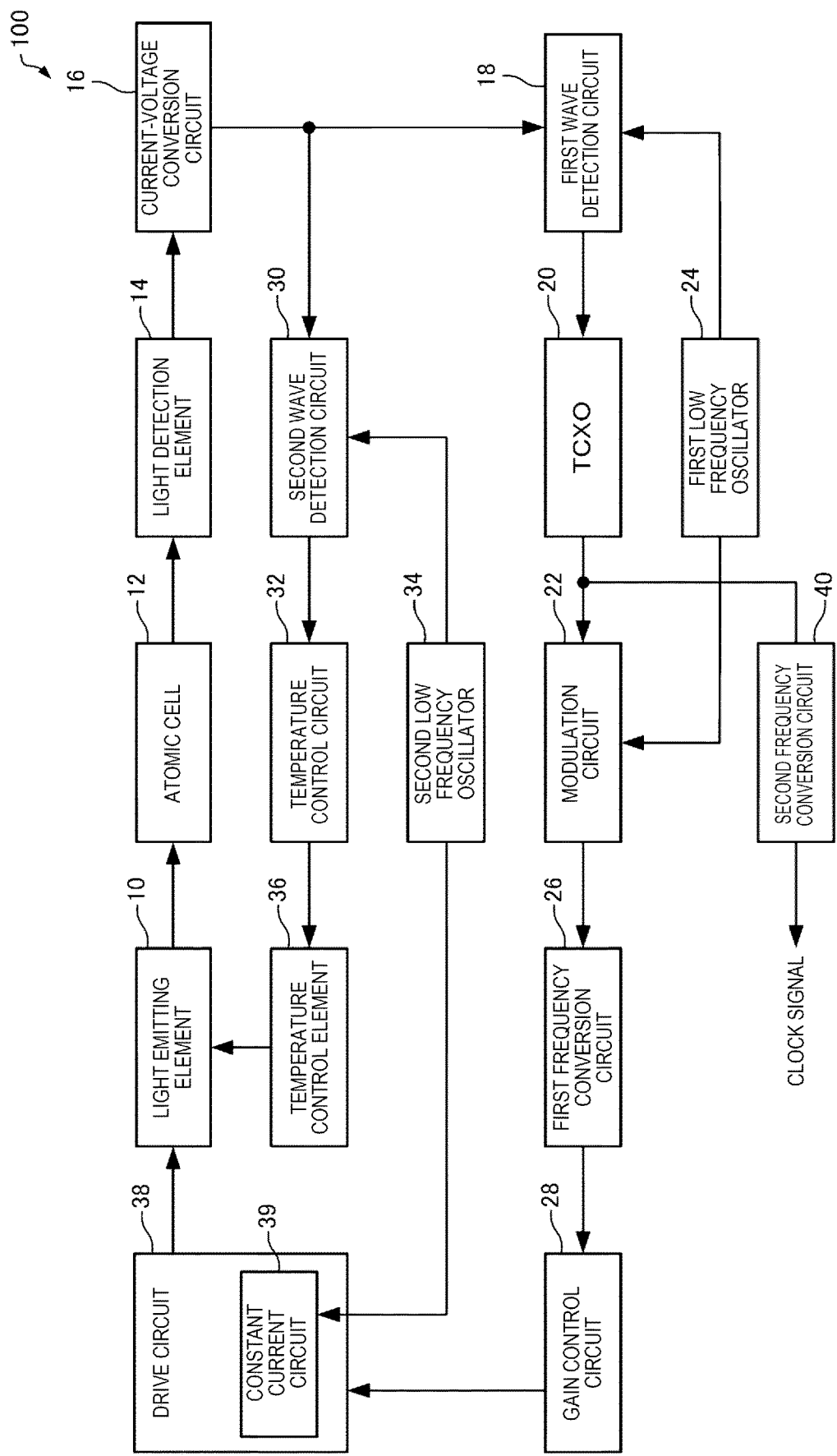
FIG. 1 is a functional block view of an atomic oscillator according to an embodiment.
Figure 2:
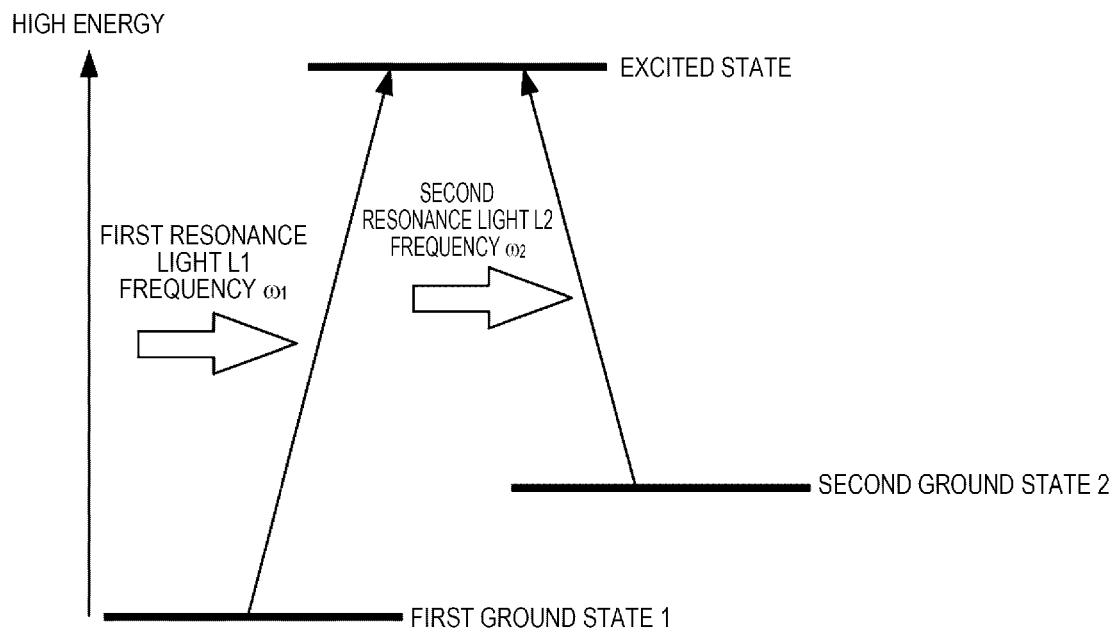
FIG. 2 is a view for explaining energy states of alkali metal atoms in an atomic cell of the atomic oscillator according to the embodiment.
Figure 3:
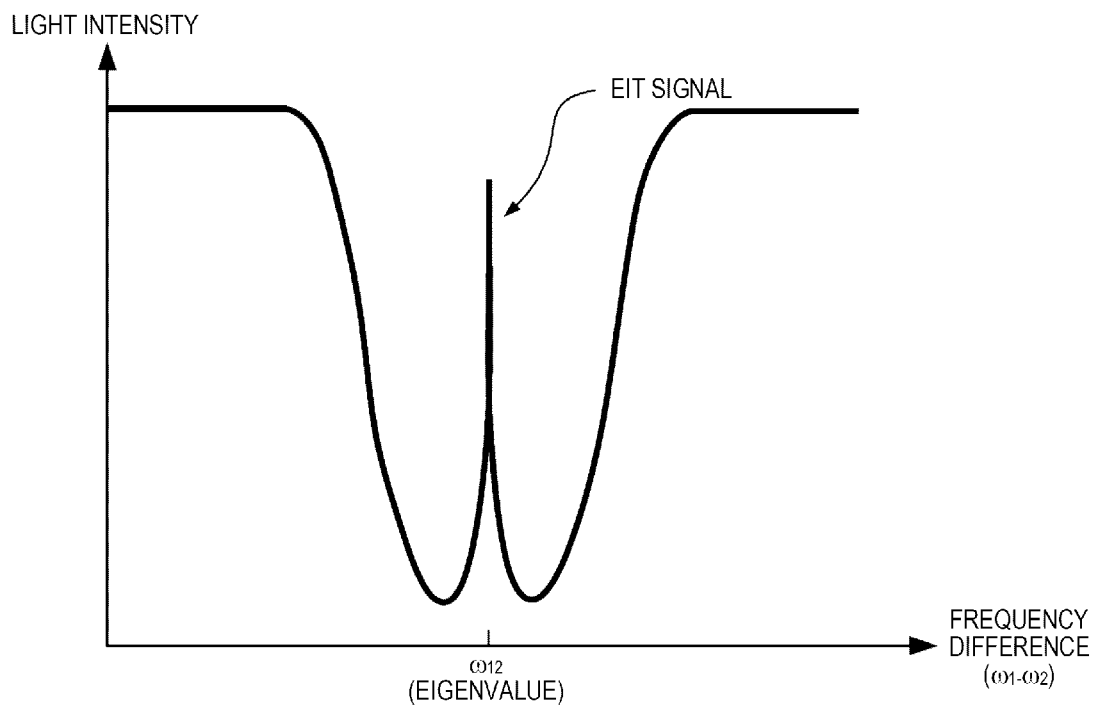
FIG. 3 is a graph showing a relationship between a frequency difference between two lights emitted from a light emitting element and an intensity of a light detected by a light detection element in the atomic oscillator according to the embodiment.

First, a configuration of an atomic oscillator according to a present embodiment will be described with reference to the drawings. FIG. 1 is a functional block view of an atomic oscillator 100 according to the present embodiment. FIG. 2 is a view for explaining energy states of alkali metal atoms in an atomic cell 12 of the atomic oscillator 100 according to the present embodiment. FIG. 3 is a graph showing a relationship between a frequency difference between two lights emitted from a light emitting element 10 and an intensity of a light detected by a light detection element 14 in the atomic oscillator 100 according to the present embodiment.

The atomic oscillator 100 is an atomic oscillator that utilizes a quantum interference effect. The atomic oscillator 100 that utilizes the quantum interference effect can be miniaturized as compared to an atomic oscillator that utilizes a double resonance effect.

First, the principle of the atomic oscillator 100 will be described.

The atomic cell 12 accommodates the alkali metal atoms such as rubidium in a gas state, cesium, sodium or the like.

The alkali metal atom, as shown in FIG. 2, has an energy level of a three-level system, and there are three possible states: two ground states with different energy levels, that is, a first ground state 1 and a second ground state 2, and an excited state. Here, the first ground state 1 is a lower energy state than the second ground state 2.

When the alkali metal atoms in a gas state are irradiated with a first resonance light L1 and a second resonance light L2 which have mutually different frequencies, a light absorption rate in the alkali metal atom of the first resonance light L1 and the second resonance light L2 rate changes, in accordance with a difference ($\omega_1-\omega_2$) between a frequency $\omega_1$ of the first resonance light L1 and a frequency $\omega_2$ of the second resonance light L2. And when the difference ($\omega_1-\omega_1$) between the frequency $\omega_1$ of the first resonance light L1 and the frequency $\omega_2$ of the second resonance light L2 matches a frequency corresponding to an energy difference between the first ground state 1 and the second ground state 2, an excitation from the ground states 1 and 2 to an excited state is stopped respectively. At this time, both the first resonance light L1 and the second resonance light L2 are transmitted without being absorbed by the alkali metal atoms. Such a phenomenon is called a CPT phenomenon or an EIT phenomenon.

Here, for example, if the frequency $\omega_1$ of the first resonance light L1 is fixed and the frequency $\omega_2$ of the second resonance light L2 is changed, an intensity of a light detected by the light detection element 14 steeply rises as shown in FIG. 3 when the difference ($\omega_1-\omega_2$) between the frequency $\omega_1$ of the first resonance light L1 and the frequency $\omega_2$ of the second resonance light L2 matches a frequency $\omega_{12}$ corresponding to an energy difference between the first ground state 1 and the second ground state 2. Such a steep signal is called an EIT signal. The EIT signal has an eigenvalue determined by the type of alkali metal atom. Therefore, by using the EIT signal as a reference, a highly accurate oscillator can be realized.

Next, a configuration of the atomic oscillator 100 will be described.

As shown in FIG. 1, the atomic oscillator 100 includes, for example, the light emitting element 10, the atomic cell 12, the light detection element 14, a current-voltage conversion circuit 16, a first wave detection circuit 18, a temperature compensated crystal oscillator (TCXO) 20, a modulation circuit 22, a first low frequency oscillator 24, a first frequency conversion circuit 26, a gain control circuit 28, a second wave detection circuit 30, a temperature control circuit 32, a second low frequency oscillator 34, a temperature control element 36, a drive circuit 38, and a second frequency conversion circuit 40.

The light emitting element 10 emits a light toward the atomic cell 12. The light emitting element 10 is, for example, a vertical cavity surface emitting laser (VCSEL), or the like. The light emitted from the light emitting element 10 is incident on the atomic cell 12 via a neutral density filter or a quarter wavelength plate (not shown in FIG. 1).

The atomic cell 12 contains the alkali metal atoms. The atomic cell 12 is irradiated with a light from the light emitting element 10. Buffer gas may be accommodated in the atomic cell 12 together with the alkali metal atoms, as needed. Examples of the buffer gas include noble gas such as argon or neon, and inert gas such as nitrogen. A part of the light incident on the atomic cell 12 is transmitted through the atomic cell 12 and incident on the light detection element 14.

The light detection element 14 detects a light that is transmitted through the atomic cell 12 and outputs a detection signal according to an intensity of the detected light. The light detection element 14 is, for example, a photodiode (PD) that outputs a detection signal according to an intensity of the received light. The output signal of the light detection element 14 is input to the current-voltage conversion circuit 16.

The current-voltage conversion circuit 16 converts the output signal of the light detection element 14 input as a current into a voltage and outputs the voltage. An output signal of the current-voltage conversion circuit 16 is input to the first wave detection circuit 18 and the second wave detection circuit 30.

The first wave detection circuit 18 detects a wave of an output signal of the current-voltage conversion circuit 16 using a first oscillation signal of the first low frequency oscillator 24 that oscillates at a low first frequency of, for example, several Hz to several hundreds of Hz. Specifically, the first low frequency oscillator 24 outputs an oscillation signal oscillating at 128 Hz. Then, according to the magnitude of the output signal of the first wave detection circuit 18, an oscillation frequency of the TCXO 20 is finely adjusted. The TCXO 20 oscillates at, for example, about several MHz to several tens of MHz. Note that the TCXO 20 is an example, and various voltage controlled oscillators (VCO) can be used instead of the TCXO.

The modulation circuit 22 modulates an output signal of the TCXO 20 using an oscillation signal of the first low frequency oscillator 24 which is the same signal as the above-mentioned first oscillation signal supplied to the first wave detection circuit 18 as a modulation signal, in order to enable a wave detection by the first wave detection circuit 18. The modulation circuit 22 can be realized by a frequency mixer (mixer), a frequency modulation (FM) circuit, an amplitude modulation (AM) circuit, or the like.

The first frequency conversion circuit 26 performs a frequency conversion of an output signal of the modulation circuit 22 into a signal of a half frequency of the frequency $\omega_{12}$ corresponding to an energy difference $\Delta E_{12}$ between two ground levels of the alkali metal atoms, and outputs the signal to the gain control circuit 28. The first frequency conversion circuit 26 can be realized, for example, using a phase locked loop (PLL) circuit.

The gain control circuit 28 amplifies the output signal of the first frequency conversion circuit 26. The gain control circuit 28 can be realized, for example, using an automatic gain control (AGC) circuit.

The second wave detection circuit 30 detects a wave of an output signal of the current-voltage conversion circuit 16, that is, a signal based on the output of the light detection element 14 using a second oscillation signal of the second low frequency oscillator 34, and outputs the wave detection signal. The second low frequency oscillator 34 oscillates at a low second frequency of several Hz to several hundreds of Hz. Specifically, the second low frequency oscillator 34 outputs an oscillation signal oscillating at 16 Hz. By making the first frequency and the second frequency different, two types of wave detection can be performed on the signal based on the output of the light detection element 14, so that a first feedback loop and a second feedback loop described later can be configured.

The temperature control circuit 32 controls the temperature control element 36 based on a wave detection signal output from the second wave detection circuit 30. Specifically, the temperature control circuit 32 outputs a voltage to the temperature control element 36 based on a wave detection signal output from the second wave detection circuit 30, and controls the temperature of the light emitting element 10 to a temperature at which the light emitting element 10 emits a light of a wavelength used for detection of the EIT signal.

The temperature control element 36 controls the temperature of the light emitting element 10 based on an output voltage of the temperature control circuit 32. As a result, the atomic oscillator 100 can control a center wavelength $\lambda_0$, that is center frequency $f_0$ of an emitted light emitted from the light emitting element 10. The temperature control element 36 is, for example, a Peltier element.

The drive circuit 38 includes a constant current circuit 39. The constant current circuit 39 generates a bias current of a specified value for driving the light emitting element 10. The drive circuit 38 superimposes a modulation current based on the oscillation signal of the second low frequency oscillator 34 on a bias current generated by the constant current circuit 39 in order to enable a wave detection by the second wave detection circuit 30, and outputs the current to the light emitting element 10. The modulation current may be an oscillation signal of the second low frequency oscillator 34 or a signal input from the second low frequency oscillator 34 to the drive circuit 38 via a phase shifter or the like. The wave detection signal output from the second wave detection circuit 30 is not input to the constant current circuit 39. Note that the "specified value" may be a value in a range of greater than or equal to a threshold value at which a laser oscillation occurs and less than or equal to a maximum allowable current value of the light emitting element 10, when the light emitting element 10 is a semiconductor laser.

Figure 4:
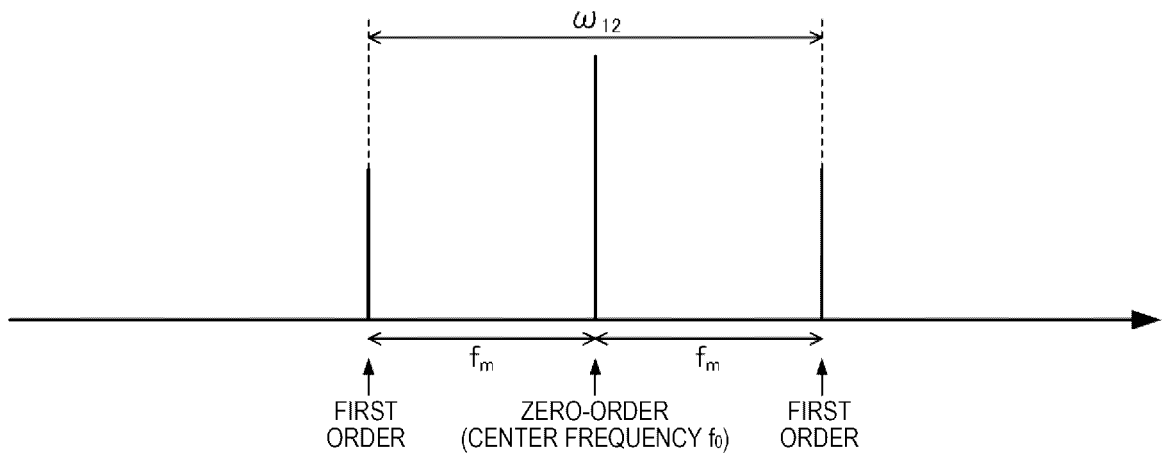
FIG. 4 is a view showing an example of a frequency spectrum of emitted light from the light emitting element of the atomic oscillator according to the embodiment.

Specifically, the drive circuit 38 generates a drive current in which the output signal of the gain control circuit 28 is superimposed on the bias current on which a modulation current is superimposed, and outputs the generated drive current to the light emitting element 10. Thereby, the light emitting element 10 generates a light including a light having a center frequency $f_0$ and a light having a frequency $f_0 \pm f_m$, that is, a first order sideband light. FIG. 4 is a diagram showing an example of a frequency spectrum of the emitted light from the light emitting element 10. In FIG. 4, a horizontal axis is a frequency of a light, and a vertical axis is an intensity of a light.

In the atomic oscillator 100, the temperature of the light emitting element 10 is controlled such that the center frequency $f_0$ of the emitted light from the light emitting element 10 is stabilized at a desired frequency by a first feedback loop passing through the light emitting element 10, the atomic cell 12, the light detection element 14, the current-voltage conversion circuit 16, the second wave detection circuit 30, the temperature control circuit 32, and the temperature control element 36.

Furthermore, in the atomic oscillator 100, a light of a frequency $f_0+f_m$ and a light of a frequency $f_0-f_m$ are controlled so as to form a pair of resonant light that causes the alkali metal atoms accommodated in the atomic cell 12 to generate an EIT phenomenon by a second feedback loop passing through the light emitting element 10, the atomic cell 12, the light detection element 14, the current-voltage conversion circuit 16, the first wave detection circuit 18, the TCXO 20, the modulation circuit 22, the first frequency conversion circuit 26, the gain control circuit 28, and the drive circuit 38. Specifically, by the second feedback loop, a feedback control is performed such that a frequency difference between the light of frequency $f_0+f_m$ and the light of frequency $f_0-f_m$ exactly matches the frequency $\omega_{12}$ corresponding to the energy difference $\Delta E_{12}$ between the two ground levels of the alkali metal atoms.

In this way, by utilizing the EIT phenomenon of the alkali metal atoms, the output signal of the first frequency conversion circuit 26 and the output signal of the TCXO 20 included in the second feedback loop are stabilized at a constant frequency.

The second frequency conversion circuit 40 converts a frequency of the output signal of the TCXO 20 to generate a clock signal of a desired frequency, for example, 10.00 MHz. The clock signal is externally output. The second frequency conversion circuit 40 can be realized, for example, by direct digital synthesizer (DDS).

1.2. Operation of Atomic Oscillator

Figure 5:
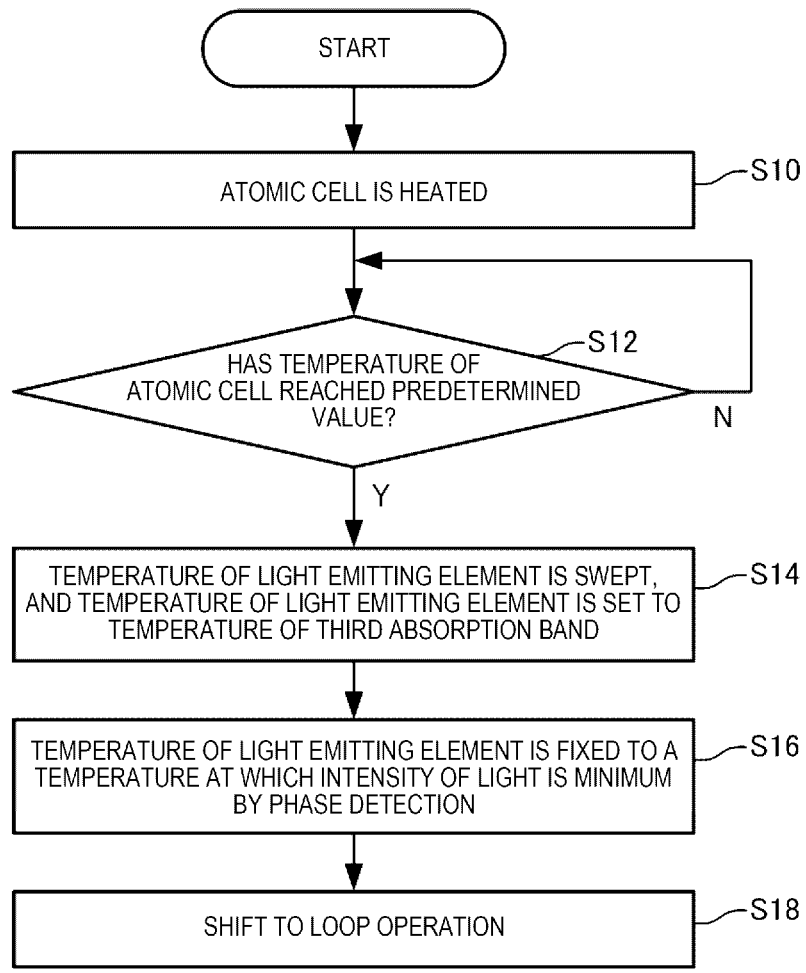
FIG. 5 is a flowchart for explaining an operation of the atomic oscillator according to the embodiment.

Next, an operation of the atomic oscillator 100 will be described with reference to the drawings. FIG. 5 is a flowchart for explaining an operation of the atomic oscillator 100. Although not shown in FIG. 1, the atomic oscillator 100 includes a heater for heating the atomic cell 12 and a heater temperature control circuit for controlling the heater. Note that the heater will be described later with reference numeral 136 in FIG. 10.

As shown in FIG. 5, when the atomic oscillator 100 is powered on, the heater temperature control circuit controls the heater to heat the atomic cell 12 (step S10).

Next, the heater temperature control circuit determines whether or not the temperature of the atomic cell 12 has reached a specified value based on an output signal of a temperature sensor (not shown) disposed in a vicinity of the atomic cell 12 (step S12).

When the temperature of the atomic cell 12 has not reached the specified value (N in step S12), the heater temperature control circuit continues heating the atomic cell 12.

On the other hand, when the temperature of the atomic cell 12 has reached the specified value (Y in step S12), the heater temperature control circuit controls the heater so that the temperature of the atomic cell 12 is maintained at the specified value. Thereafter, the process shifts to step S14.

In step S14, the temperature control circuit 32 sweeps the temperature of the light emitting element 10, and controls the temperature control element 36 such that the temperature of the light emitting element 10 is any temperature $T_0$ included in a temperature range corresponding to a third absorption band (step S14). The third absorption band is described below.

Figure 6:
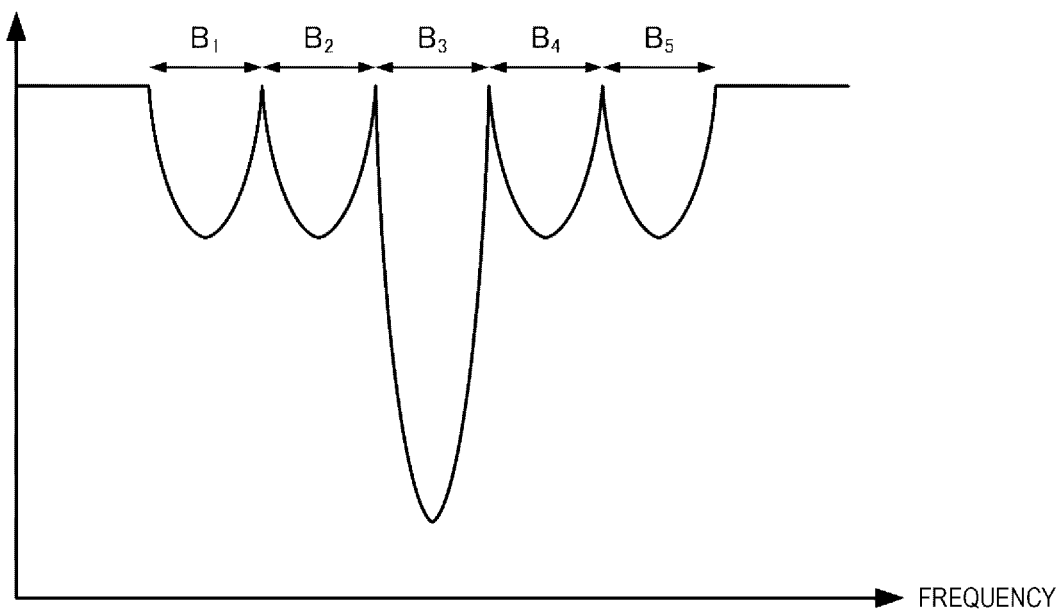
FIG. 6 is a view showing an intensity of a light detected by a light detection element when a frequency of the emitted light of the light emitting element of the atomic oscillator according to the embodiment is swept.

FIG. 6 is a view showing an intensity of a light detected by the light detection element 14 when a frequency of the emitted light of the light emitting element 10 is swept. By sweeping the temperature of the light emitting element 10, the frequency of the emitted light can be swept.

In the atomic oscillator 100, as shown in FIG. 4, the light emitting element 10 generates a light having a center frequency $f_0$ and a pair of first order sideband light having a frequency of $f_0 \pm f_m$, and the pair of first order sideband light becomes a pair of resonant light. Therefore, when the temperature of the light emitting element 10 is swept and the center frequency $f_0$ of the emitted light from the light emitting element 10 is swept, as shown in FIG. 6, five absorption bands of a first absorption band $B_1$ where only a light of $f_0+f_m$ is absorbed, a second absorption band $B_2$ where only a light of $f_0$ is absorbed, a third absorption band $B_3$ where a light of $f_0+f_m$ and a light of $f_0-f_m$ are absorbed, a fourth absorption band $B_4$ where only a light of $f_0$ is absorbed, and a fifth absorption band $B_5$ where only a light of $f_0-f_m$ is absorbed, are observed in this order. Among these, for example, at a minimum point of the third absorption band $B_3$, an intensity of a light has a minimum value.

In step S14, the temperature control element 36 is controlled such that the temperature of the light emitting element 10 becomes any of the temperatures $T_0$ of the third absorption band $B_3$ as described above. In step S14, the temperature sweep of the light emitting element 10 is performed in a state where the bias current output to the light emitting element 10 is fixed to a preset value.

Next, the bias current is modulated by the oscillation signal of the second low frequency oscillator 34, and the temperature control circuit 32 controls the temperature control element 36 such that the intensity of the light detected by the light detection element 14 is minimized by performing a phase detection of a wave on the output signal of the light detection element 14 using the oscillation signal of the second low frequency oscillator 34 in the second wave detection circuit 30 (step S16).

Figure 7:
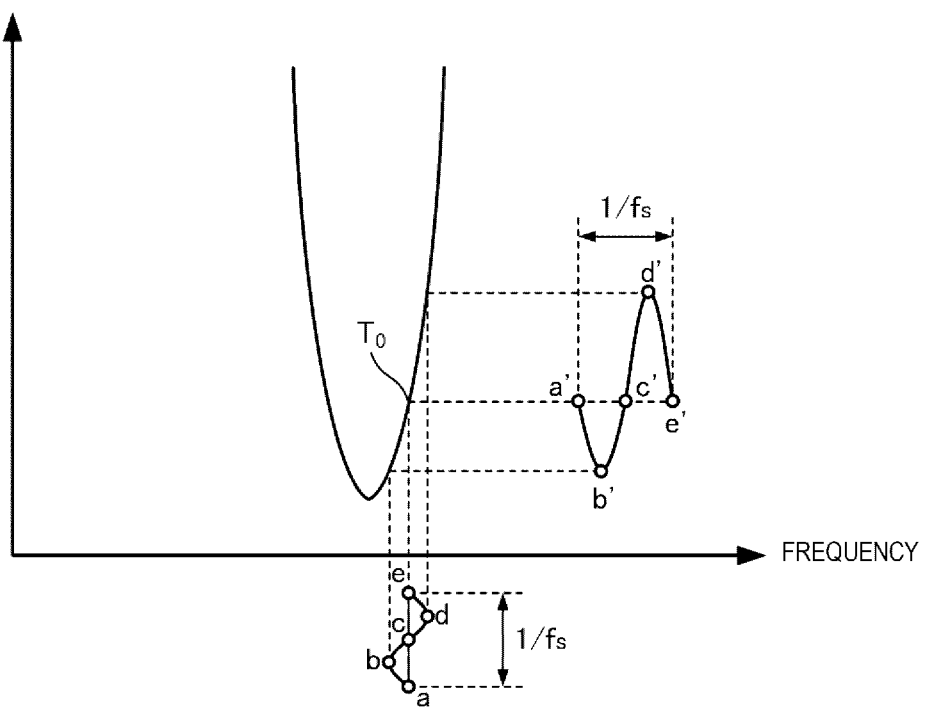
FIG. 7 is a view for explaining the principle of a phase detection of a wave in the atomic oscillator according to the embodiment.
Figure 8:
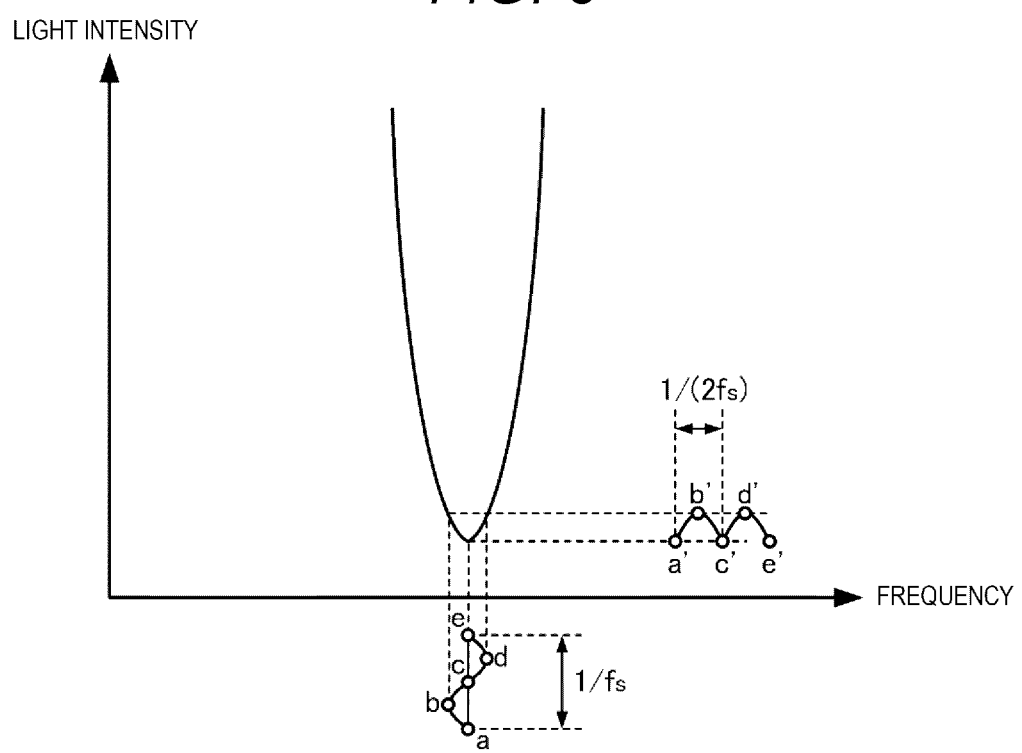
FIG. 8 is a view for explaining the principle of the phase detection of a wave in the atomic oscillator according to the embodiment.

The principle of the phase detection of a wave will be described using FIGS. 7 and 8. In FIGS. 7 and 8, the horizontal axis represents the center frequency $f_0$ of the emitted light from the light emitting element 10, and the vertical axis is the intensity of light detected by the light detection element 14. Note that, for convenience, in FIGS. 7 and 8, only a part of the third absorption band $B_3$ shown in FIG. 6 is illustrated.

As shown in FIG. 7, when the center frequency $f_0$ is shifted higher than the minimum point of the absorption band, that is, when the temperature $T_0$ is shifted higher than the minimum point of the absorption band, since points of the sine waves a, b, c, d, and e having a frequency of $f_s$, which are oscillation signals of the second low frequency oscillator 34, appear as points a', b', c', d' and e' at the output of the light detection element 14, respectively, the output signal of the light detection element 14 contains many frequency components of $f_s$. Therefore, in the second wave detection circuit 30, a direct current signal with a negative polarity can be extracted by integrating with a filter, after inverting the output signal of the light detection element 14 only for polarities of the signals c' to e' corresponding to a half cycle centering on voltages of a', c' and e' by using a rectangular wave having a frequency of $f_s$, which is an oscillation signal of the second low frequency oscillator 34 in phase with this output signal. When an output voltage of the second wave detection circuit 30 is negative, the temperature control circuit 32 decreases the voltage applied to the temperature control element 36 to lower the temperature of the light emitting element 10. Thereby, the center frequency $f_0$ decreases and approaches the minimum point of the third absorption band $B_3$.

Although not shown, when the center frequency $f_0$ is shifted lower side than the minimum point of the absorption band, the output voltage of the second wave detection circuit 30 becomes positive, and the temperature control circuit 32 increases the voltage applied to the temperature control element 36 to raise the temperature of the light emitting element 10. Thereby, the center frequency $f_0$ increases and approaches the minimum point of the absorption band.

As shown in FIG. 8, when the center frequency $f_0$ coincides with the minimum point of the third absorption band $B_3$, the output signal of the light detection element 14 contains many frequency components of $2f_s$, and a waveform of the signal becomes nearly symmetrical centering on the point c'. Therefore, in the second wave detection circuit 30, it becomes substantially zero when integrated by the filter, after inverting the output signal of the light detection element 14 only for polarities of the signals c' to e' corresponding to a half cycle centering on voltages of a', c' and e' by using a rectangular wave having a frequency of $f_s$, which is an oscillation signal of the second low frequency oscillator 34 in phase with this signal. When the output voltage of the second wave detection circuit 30 is zero, the temperature control circuit 32 does not change the voltage applied to the temperature control element 36. Thereby, the center frequency $f_0$ does not change, and the center frequency $f_0$ can be stabilized at the minimum point of the absorption band.

As described above, in step S16, the temperature control circuit 32 controls the temperature control element 36 such that the intensity of the light detected by the light detection element 14 is minimized.

Thereafter, the atomic oscillator 100 shifts to loop operation (step S18). Specifically, as described above, the temperature of the light emitting element 10 is controlled so that the center frequency $f_0$ of the light generated by the light emitting element 10 is stabilized at a desired frequency by the first feedback loop. Furthermore, it is controlled so that the light of frequency $f_0+f_m$ and the light of frequency $f_0-f_m$ become a pair of resonant light that causes the alkali metal atoms contained in the atomic cell 12 to generate an EIT phenomenon by the second feedback loop. The operation of the second feedback loop is known, and thus the detailed description is omitted.

1.3. Specific Configuration of Atomic Oscillator

Figure 9:
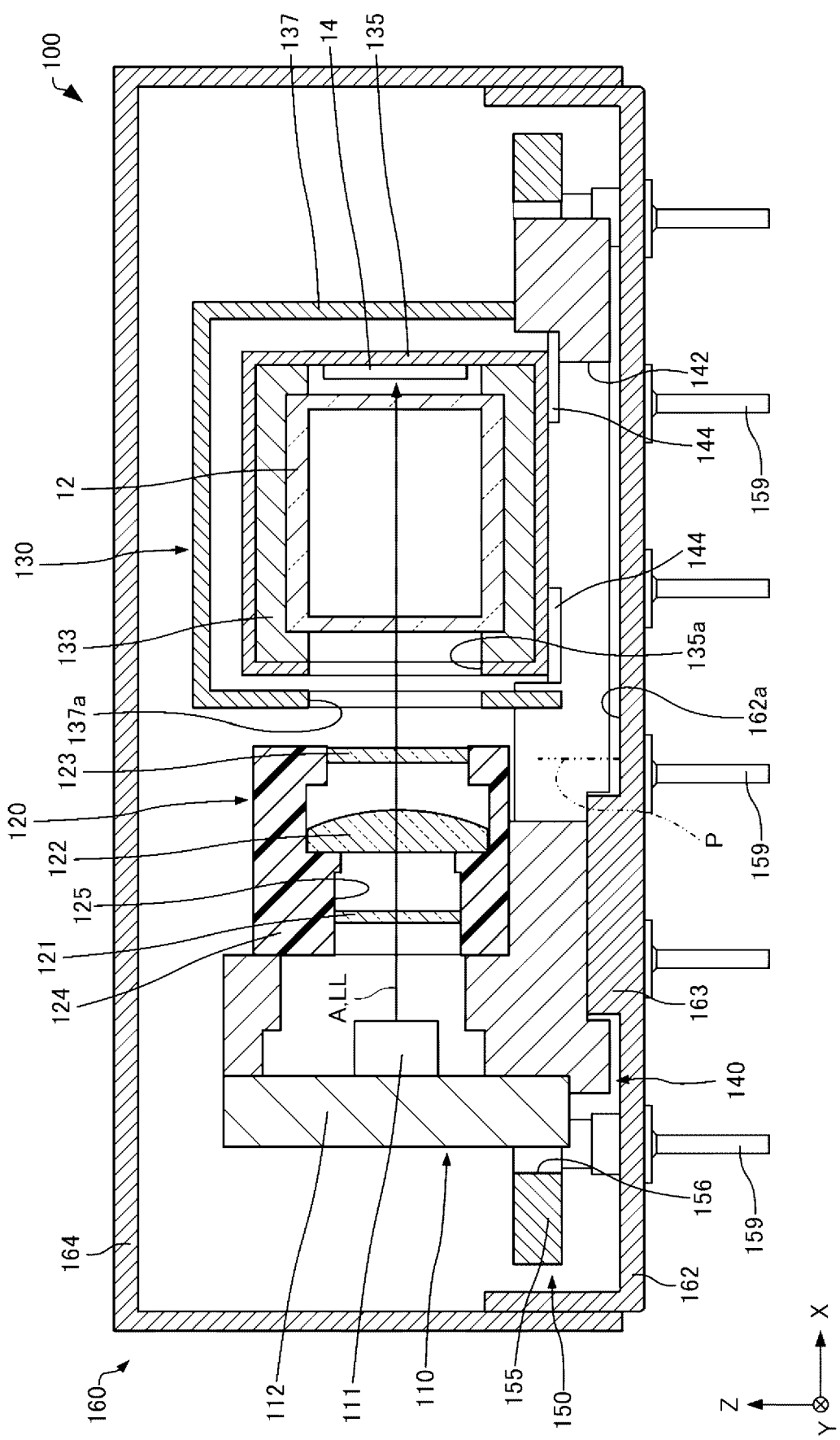
FIG. 9 is a cross-sectional view schematically showing the atomic oscillator according to the embodiment.
Figure 10:
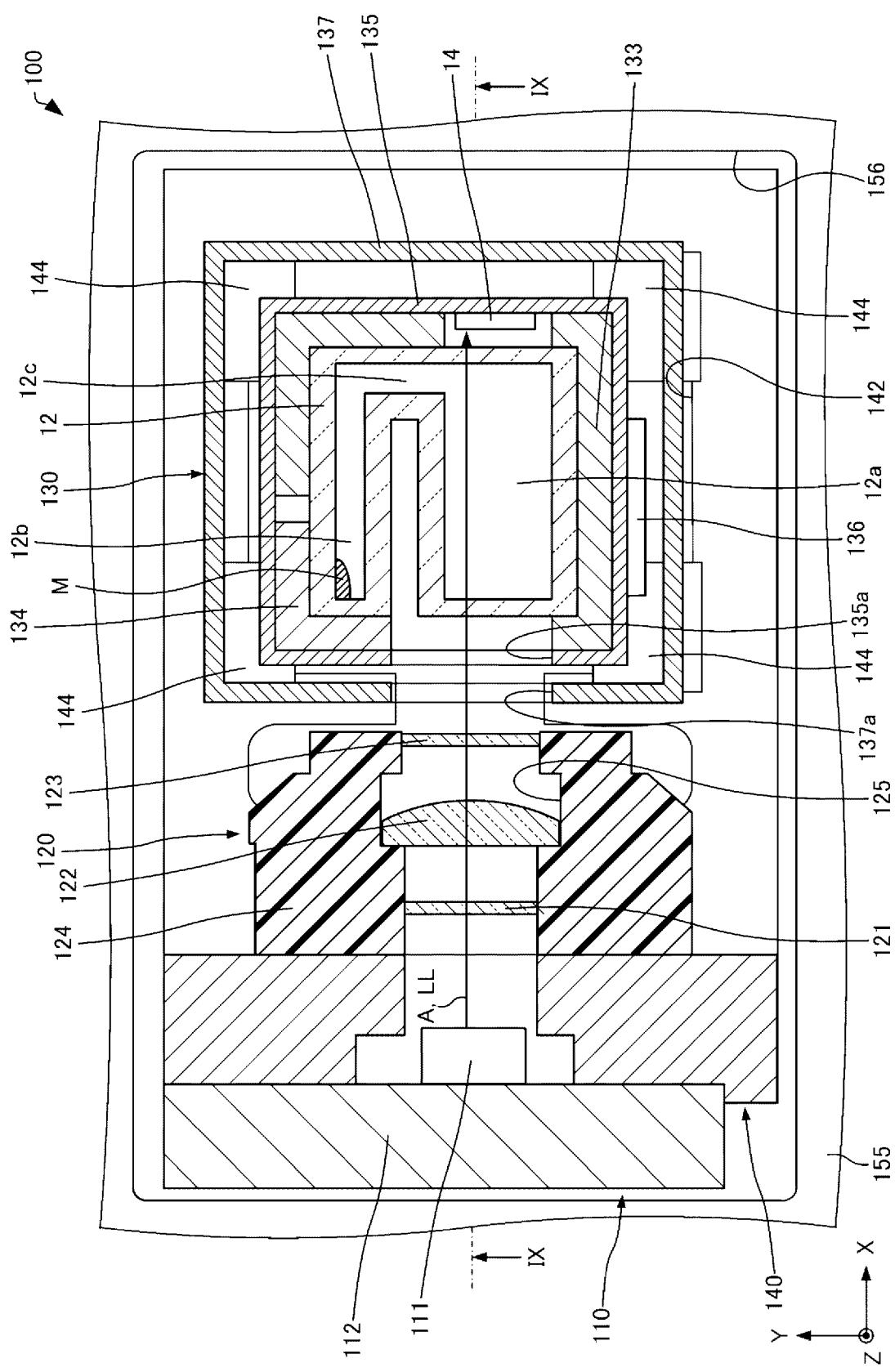
FIG. 10 is a cross-sectional view schematically showing the atomic oscillator according to the embodiment.

Next, a specific configuration of the atomic oscillator 100 will be described. FIGS. 9 and 10 are cross-sectional views schematically showing the atomic oscillator 100. Note that FIG. 9 is a cross-sectional view taken along the line IX-IX in FIG. 10. Further, in FIGS. 9 and 10, X, Y, and Z axes are shown as three axes orthogonal to each other.

As shown in FIGS. 9 and 10, the atomic oscillator 100 includes a light source unit 110, an optical system unit 120, an atomic cell unit 130, a supporting member 140, a control unit 150, and an outer container 160.

Here, as shown in FIG. 9, the Z axis is an axis along the perpendicular P of an inner surface 162a of a base body 162 of the outer container 160, and the Z axis+direction is a direction from the inner surface 162a to a component disposed on the inner surface 162a. The X axis is an axis along the light LL emitted from the light source unit 110 and the X axis+direction is a direction in which the light LL advances. The Y axis is an axis perpendicular to the X axis and the Z axis and the Y axis+direction is a direction from the front to the back when the Z axis+direction is up and the X axis+direction is directed to the right.

Figure 11:
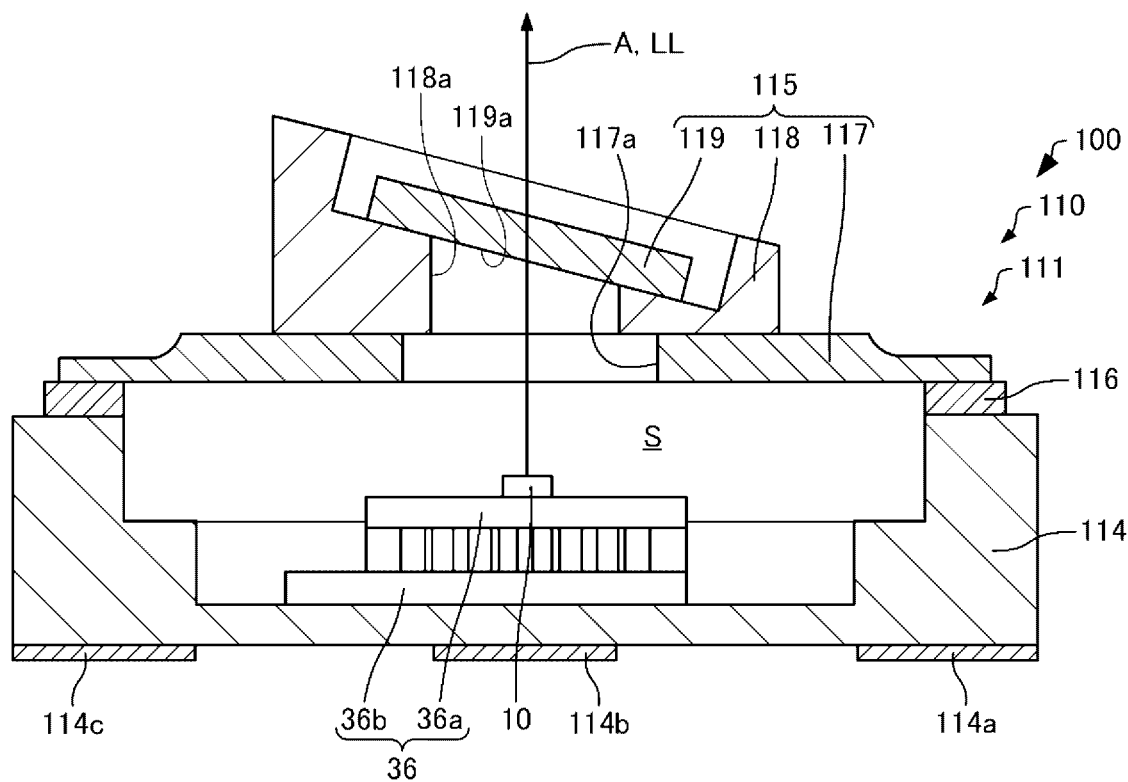
FIG. 11 is a cross-sectional view schematically showing a light source unit of the atomic oscillator according to the embodiment.

The light source unit 110 is disposed on the supporting member 140. The light source unit 110 has a light source container 111 and a light source substrate 112 on which the light source container 111 is disposed. FIG. 11 is a cross-sectional view schematically showing the light source unit 110. Note that the light source substrate 112 is omitted in FIG. 11 for the sake of convenience. Further, in FIGS. 9 and 10, the light source container 111 is simplified and shown in the figure.

As shown in FIG. 11, the light source unit 110 has the light emitting element 10, the temperature control element 36, and the light source container 111 accommodates these elements therein. The light emitting element 10 and the temperature control element 36 are electrically connected to the control unit 150.

The light source container 111 has a base 114 and a lid 115 that closes an opening of a recess portion provided in the base 114. An internal space S of the light source container 111 may be in a reduced pressure state. Thereby, a convection flow generated in the light source container 111 can be suppressed, and an influence of a temperature change outside the light source container 111 on the light emitting element 10 in the light source container 111 can be reduced. Note that the inside of the light source container 111 may not be in a reduced pressure state, and an inert gas such as nitrogen, helium or argon may be enclosed in the light source container 111.

The material of the base 114 is, for example, various ceramics such as oxide ceramics such as alumina, silica, titania, zirconia, nitride based ceramics such as silicon nitride, aluminum nitride and titanium nitride, carbide based ceramics such as silicon carbide.

Mounting electrodes 114a, 114b, and 114c are provided on the outer surface of the base 114. The mounting electrodes 114a, 114b, and 114c are electrically connected to the light emitting element 10, the temperature control element 36, or the like by wiring (not shown). The material of the mounting electrodes 114a, 114b, and 114c is, for example, gold, platinum, aluminum, nickel or the like.

A frame shaped seal ring 116 is provided between the base 114 and the lid 115. The material of the seal ring 116 is, for example, Kovar or the like. The seal ring 116 is joined to the base 114 by brazing, for example. The lid 115 is joined to the base 114 by seam welding or the like via the seal ring 116.

The lid 115 has a plate shaped main body 117, a cylinder shaped protruding portion 118 provided on the main body 117, and a window portion 119 closing an opening 118a provided on an inner side of the protruding portion 118.

The main body 117 is provided with an opening 117a communicating with the opening 118a. The protruding portion 118 is provided to protrude from the main body 117. The material of the main body 117 and the protruding portion 118 is, for example, Kovar or the like. The material of the window portion 119 is, for example, glass or the like. The light LL emitted from the light emitting element 10 passes through the openings 117a and 118a, is transmitted through the window portion 119, and is emitted to the outside of the light source container 111.

An incident surface 119a of the window portion 119 is inclined with respect to an optical axis A of the light LL. That is, the incident surface 119a is not orthogonal to and not parallel to the optical axis A. Therefore, for example, compared with a case where the incident surface of the window portion is orthogonal to the optical axis A, it is possible to reduce a light LL reflected by the window portion 119 and returned to the light emitting element 10.

The temperature control element 36 is disposed on the base 114. The temperature control element 36 is fixed to the base 114 by, for example, an adhesive. The temperature control element 36 is a Peltier element having substrates 36a and 36b. In the illustrated example, the light emitting element 10 is disposed on the substrate 36a.

In the temperature control elements 36, one of the substrates 36a and 36b becomes a heat generation side and the other becomes a heat absorption side by the Peltier effect. The temperature control element 36 can switch between a state in which the substrate 36a becomes the heat generation side and the substrate 36b becomes the heat absorption side depending on a direction of the supplied current and a state in which the substrate 36a becomes the heat absorption side and the substrate 36b becomes the heat generation side. Therefore, even if a range of the environmental temperature is wide, the temperature control element 36 can adjust the temperature of the light emitting element 10 to a desired temperature. Further, since the temperature control element 36 can perform a heat generation and a heat absorption, a wavelength of the light emitting element 10 can be controlled by temperature more easily than, for example, when a heater is used.

As shown in FIG. 9, the optical system unit 120 is disposed on the supporting member 140. The optical system unit 120 has a neutral density filter 121, a lens 122, a quarter wavelength plate 123, and a holder 124 which holds the neutral density filter 121, the lens 122, and the quarter wavelength plate 123. The holder 124 is, for example, fixed to the supporting member 140.

The holder 124 is provided with a through hole 125. The through hole 125 is a passing area of the light LL. In the through hole 125, the neutral density filter 121, the lens 122, and the quarter wavelength plate 123 are arranged in the order from the light source unit 110 side.

The atomic cell unit 130 has the atomic cell 12, the light detection element 14, a first holding member 133, a second holding member 134, a first atomic cell container 135, the heater 136, and a second atomic cell container 137.

As shown in FIG. 10, the atomic cell 12 is provided with a first chamber 12a through which the light LL passes, a second chamber 12b, and a communication portion 12c communicating the first chamber 12a with the second chamber 12b. The alkali metal atoms in a gas state are present in the first chamber 12a. The alkali metal atoms M in a liquid state are present in the second chamber 12b. Therefore, when the alkali metal atoms in a gas state present in the first chamber 12a are reduced due to a reaction with the wall of the atomic cell 12 or the like, the alkali metal atom M in a liquid state is vaporized and a concentration of the alkali metal atoms in a gas state present in the first chamber 12a can be kept constant. The material of the wall of the atomic cell 12 is, for example, a glass. Note that the shape of the atomic cell 12 is not specifically limited, and, for example, the second chamber 12b and the communication portion 12c may not be provided.

The light detection element 14 receives a light that has passed through the first chamber 12a. The light detection element 14 is disposed on the side opposite to the light emitting element 10 with respect to the first chamber 12a. In the illustrated example, the light detection element 14 is disposed in the first atomic cell container 135. The light detection element 14 is electrically connected to the control unit 150.

The first holding member 133 and the second holding member 134 hold the atomic cell 12. The holding members 133 and 134 are disposed on an outer surface of the atomic cell 131. The thermal conductivity of the holding members 133 and 134 is higher than the thermal conductivity of the wall of the atomic cell 12 and the thermal conductivity of the first atomic cell container 135. A material of the holding members 133 and 134 is, for example, aluminum, titanium, copper, brass, or the like.

The first holding member 133 transmits a heat of the heater 136 to the alkali metal atoms in a gas state contained in the first chamber 12a. The first holding member 133 is disposed so as to surround the first chamber 12a, for example. The second holding member 134 is disposed apart from the first holding member 133. The second holding member 134 is disposed so as to surround the alkali metal atoms M in a liquid state, for example. The temperature of the second holding member 134 is lower than the temperature of the first holding member 133. The holding members 133 and 134 have a structure for passing the light LL.

The first atomic cell container 135 contains the atomic cell 12, the light detection element 14, and the holding members 133 and 134. The first atomic cell container 135 has a substantially rectangular parallelepiped outer shape. The first atomic cell container 135 is provided with a through hole 135a through which the light LL passes. A material of the first atomic cell container 135 is, for example, permalloy, silicon iron, or the like. By using such a material, the first atomic cell container 135 can shield a magnetic field from the outside. Thereby, an influence of the alkali metal atoms in the atomic cell 12 by the magnetic field from the outside can be suppressed, and the oscillation characteristic of the atomic oscillator 100 can be stabilized.

The heater 136 is disposed, for example, on the outer surface of the first atomic cell container 135. In the illustrated example, the heater 136 is disposed on the outer surface of a part of the first atomic cell container 135 in contact with the first holding member 133. The heater 136 heats the first chamber 12a via the first atomic cell container 135 and the first holding member 133.

The second atomic cell container 137 contains the first atomic cell container 135 and the heater 136. The second atomic cell container 137 is provided with a through hole 137a through which the light LL passes. A material of the second atomic cell container 137 is, for example, the same as the material of the first atomic cell container 135. The second atomic cell container 137 can shield the magnetic field from the outside. The first atomic cell container 135 and the second atomic cell container 137 are disposed, for example, apart from each other. Therefore, for example, compared with a case where the first atomic cell container 135 and the second atomic cell container 137 are in contact with each other, a function of shielding the magnetic field from the outside can be enhanced.

Note that although not shown, the atomic cell unit 130 has a coil. The coil applies a magnetic field in a specified direction to the alkali metal atoms contained in the atomic cell 12 and Zeeman splits an energy level of the alkali metal atoms. When the alkali metal atoms are irradiated with a pair of circularly polarized resonance light in a state where the alkali metal atoms are Zeeman split, the number of alkali metal atoms having a desired energy level is relatively larger than the number of alkali metal atoms having other energy levels among a plurality of levels of the alkali metal atoms that are Zeeman split. Therefore, the number of atoms that develop a desired EIT phenomenon increases, and a desired EIT signal increases. As a result, the oscillation characteristics of the atomic oscillator 100 can be improved.

As shown in FIG. 9, the supporting member 140 is fixed to the base body 162 of the outer container 160 in a cantilever manner. In the illustrated example, the supporting member 140 is fixed to a pedestal portion 163 of the base body 162. A material of the supporting members 140 is, for example, aluminum, or copper. The supporting member 140 may be a carbon sheet using a carbon fiber.

The supporting member 140 is provided with a through hole 142. The through hole 142 passes through the supporting member 140 along the Z axis direction. When viewed along the Z axis, the atomic cell unit 130 is disposed so as to overlap with the through hole 142. The atomic cell unit 130 is supported by the supporting member 140. In the illustrated example, the first atomic cell container 135 is supported by the supporting member 140 via a spacer 144.

A material of the spacer 144 is, for example, a resin such as an engineering plastic, a liquid crystal polymer (LCP) resin, a polyether ether ketone (PEEK), or the like.

The control unit 150 has a circuit substrate 155. The circuit substrate 155 is fixed to the base body 162 of the outer container 160 via a plurality of lead pins 159. The circuit substrate 155 is provided with an integrated circuit (IC) chip (not shown). The IC chip functions as, for example, the current-voltage conversion circuit 16 as shown in FIG. 1, the wave detection circuits 18 and 30, the modulation circuit 22, the frequency conversion circuits 26 and 40, the gain control circuit 28, the temperature control circuit 32, and the drive circuit 38. The IC chip is electrically connected to the light source unit 110 and the atomic cell unit 130. The circuit substrate 155 is provided with a through hole 156 through which the supporting member 140 is inserted.

The outer container 160 contains the light source unit 110, the optical system unit 120, the atomic cell unit 130, the supporting member 140, and the control unit 150. The outer container 160 has the base body 162 and a lid body 164 that is a separate body from the base body 162. A material of the outer container 160 is, for example, the same as the material of the first atomic cell container 135. Therefore, the outer container 160 can shield a magnetism from the outside, and inhibit the alkali metal atoms in the atomic cell 12 from being influenced by the magnetism from the outside. The inside of the outer container 160 may be a nitrogen atmosphere or a vacuum.

The atomic oscillator 100 has, for example, the following effects.

The atomic oscillator 100 detects a wave of a signal, which is based on an output of the light detection element 14, using an oscillation signal of the second low frequency oscillator 34, and includes the second wave detection circuit 30 that outputs a wave detection signal, the temperature control circuit 32 that controls the temperature control element 36 based on a wave detection signal output from the second wave detection circuit 30, the constant current circuit 39 that generates a current of a specified value for driving the light emitting element 10, and the drive circuit 38 that superimposes a modulation current according to an oscillation signal of the second low frequency oscillator 34 on a current generated by the constant current circuit 39 and outputs the current to the light emitting element 10.

Figure 12:
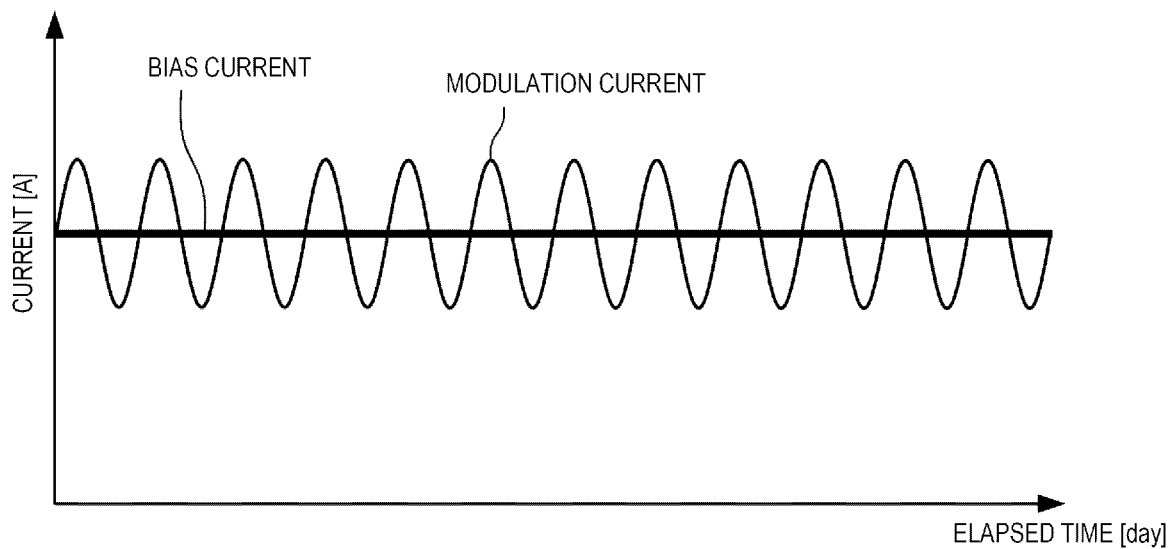
FIG. 12 is a graph for explaining a relationship between elapsed time and a current input to the light emitting element.
Figure 13:
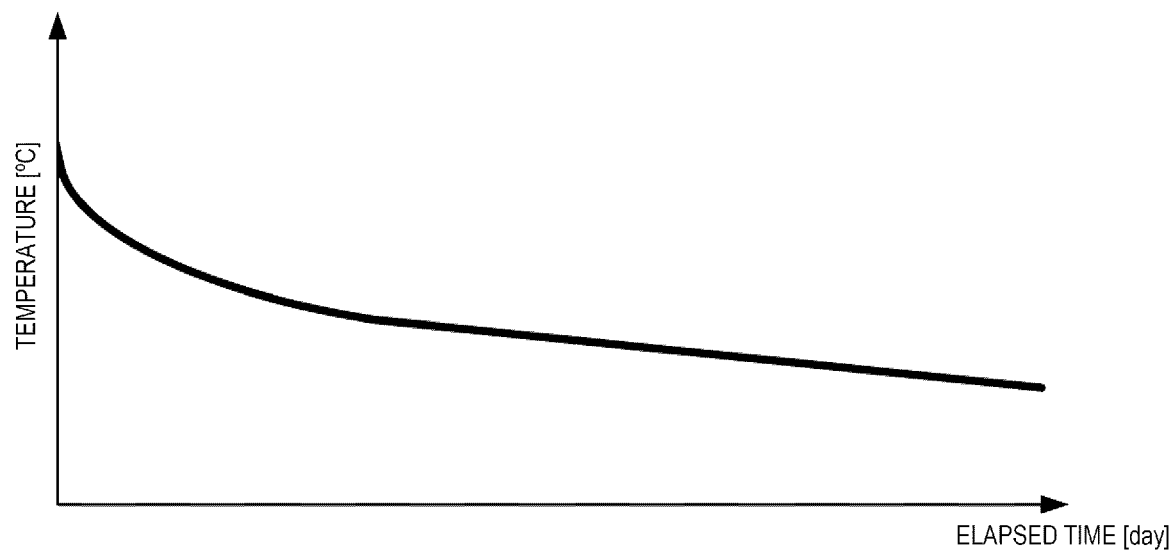
FIG. 13 is a graph for explaining a relationship between elapsed time and a temperature of the light emitting element.
Figure 14:
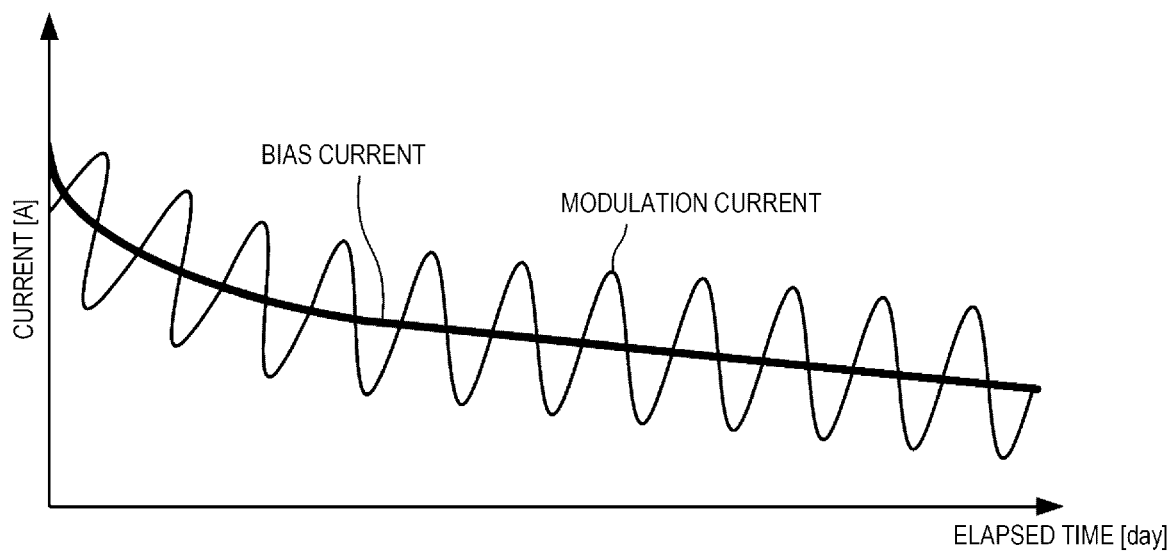
FIG. 14 is a graph for explaining a relationship between elapsed time and the current input to the light emitting element.

Therefore, in the atomic oscillator 100, as shown in FIG. 12, for example, the bias current input to the light emitting element 10 can be made constant, and as shown in FIG. 13, the center frequency $f_0$ of the emitted light from the light emitting element 10, that is, the center wavelength $\lambda_0$ can be controlled by the temperature of the light emitting element 10. Thereby, for example, the temperature of the light emitting element is made constant, and as shown in FIG. 14, the amount of change in the light amount of the light emitting element 10 can be made smaller as compared with a case where the center frequency $f_0$ is controlled by the bias current input to the light emitting element. Therefore, the light shift can be reduced. In a semiconductor laser such as the light emitting element 10, when the center wavelength $\lambda_0$ is changed by $\Delta\lambda$, by the temperature, the amount of change in the light amount of the semiconductor laser can be suppressed to about 1/20 as compared with a case where the center wavelength $\lambda_0$ is changed by $\Delta\lambda$, by the bias current. Note that FIGS. 12 and 14 are graphs for explaining a relationship between elapsed time and a current input to the light emitting element. FIG. 13 is a graph for explaining a relationship between elapsed time and the temperature of the light emitting element.

Figure 15:
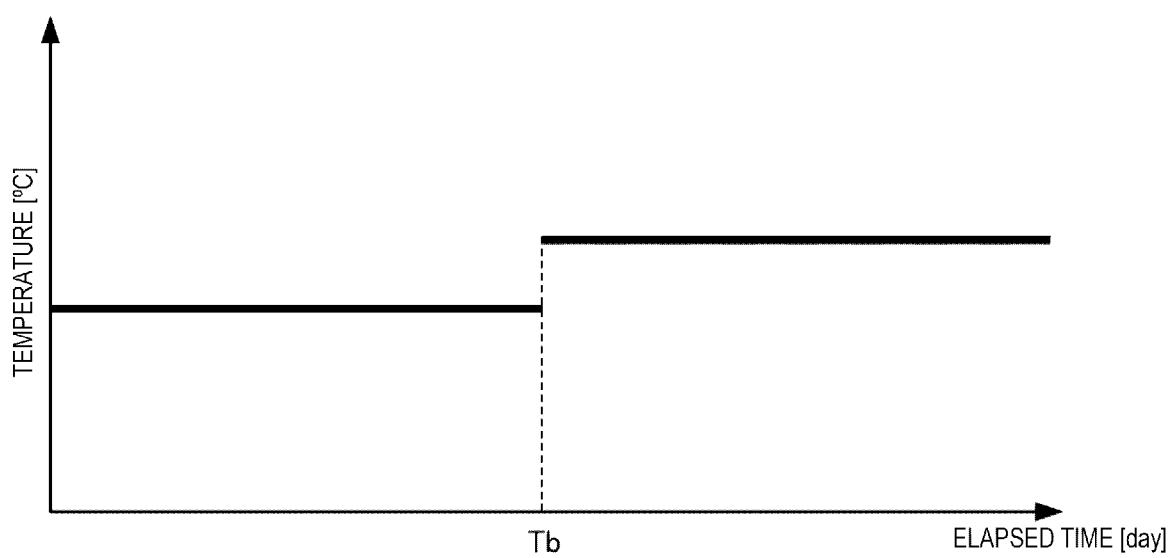
FIG. 15 is a graph for explaining a relationship between elapsed time and the temperature of the light emitting element.

Furthermore, in the atomic oscillator 100, since the temperature control circuit 32 controls the temperature control element 36 based on the wave detection signal output from the second wave detection circuit 30, an operating current value is unlikely to fluctuate rapidly in a short time or to become discontinuous. For example, as shown in FIG. 15, at the time Tb when the bias current reaches a specified value, as compared with a case of changing the temperature of the light emitting element, the operation current value is unlikely to fluctuate rapidly in a short time or to become discontinuous. Note that FIG. 15 is a graph for explaining a relationship between elapsed time and the temperature of the light emitting element.

As a result, the atomic oscillator 100 can have high frequency stability.

In the atomic oscillator 100, the wave detection signal output from the second wave detection circuit 30 is not input to the constant current circuit 39. Therefore, in the atomic oscillator 100, the constant current circuit 39 can generate, for example, a current of a constant value for driving the light emitting element 10, and can reduce the light shift.

In the atomic oscillator 100, the temperature control circuit 32 controls the temperature of the light emitting element 10 to a temperature at which the light emitting element 10 emits a light of a wavelength used for detection of the EIT signal. Therefore, in the atomic oscillator 100, it is not necessary to control the center wavelength $\lambda_0$ of the emitted light from the light emitting element 10 due to the bias current driving the light emitting element 10.

Note that although the atomic oscillator 100 includes the first low frequency oscillator 24 and the second low frequency oscillator 34, at least one low frequency oscillator may be sufficient. For example, in the atomic oscillator according to the present embodiment, a low frequency oscillator that outputs a first oscillation signal to the first wave detection circuit and the modulation circuit, and a frequency divider that divides or multiplies the first oscillation signal and outputs a second oscillation signal may be included, and the second oscillation signal may be input to the second wave detection circuit and the constant current circuit. Further, for example, in the atomic oscillator according to the present embodiment, the low frequency oscillator that outputs the first oscillation signal to the second wave detection circuit and the constant current circuit, and the frequency divider that divides or multiplies the first oscillation signal and outputs the second oscillation signal may be included, and the second oscillation signal may be input to the first wave detection circuit and the modulation circuit. The atomic oscillator according to the present embodiment may include at least one oscillator that outputs a first oscillation signal of a first frequency and a second oscillation signal of the first frequency.

2. Modification Example of Atomic Oscillator

Figure 16:
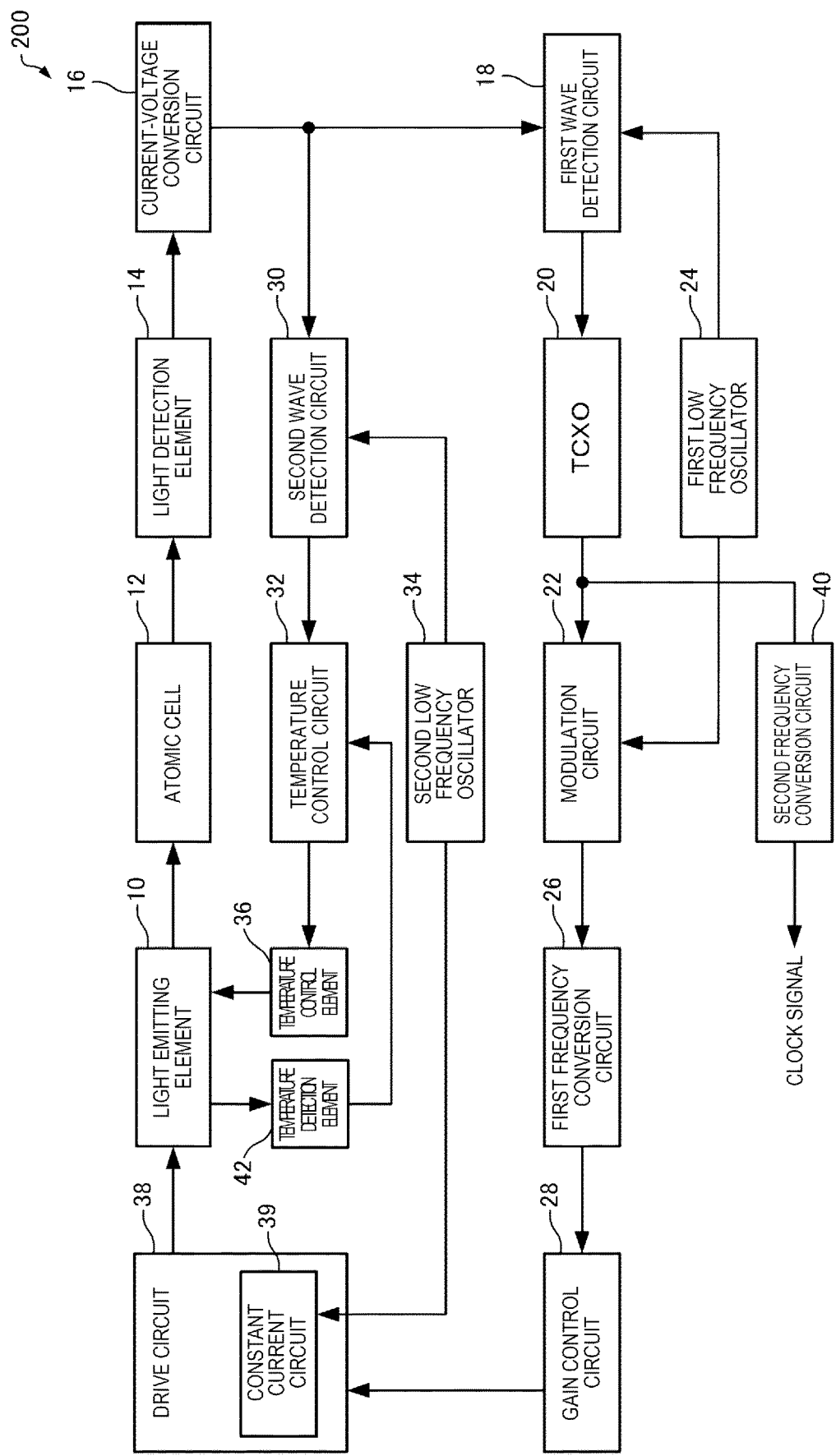
FIG. 16 is a functional block view of the atomic oscillator according to a modification example of the embodiment.
Figure 17:
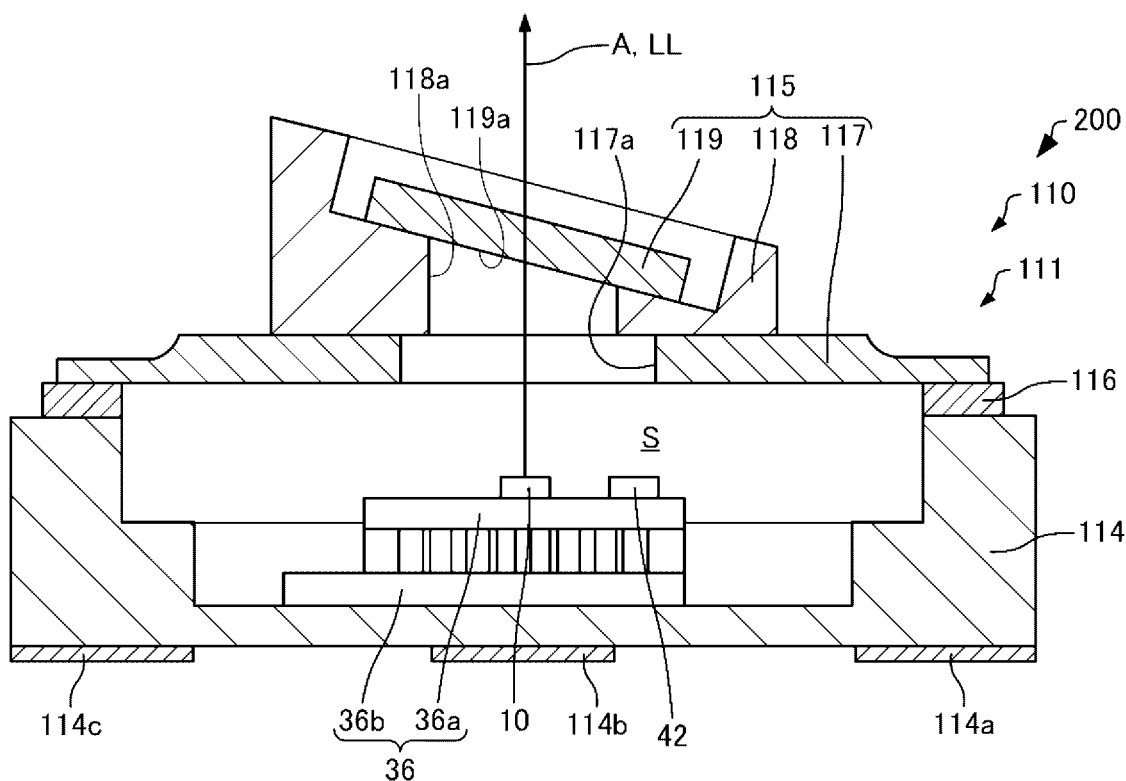
FIG. 17 is a cross-sectional view schematically showing the light source unit of the atomic oscillator according to the modification example of the embodiment.

Next, the atomic oscillator according to a modification example of the present embodiment will be described with reference to the drawings. FIG. 16 is a functional block view of an atomic oscillator 200 according to the modification example of the present embodiment. FIG. 17 is a cross-sectional view schematically showing the light source unit 110 of the atomic oscillator 200 according to the modification example of the embodiment. Note that the light source substrate 112 is omitted in FIG. 17 for the sake of convenience.

Hereinafter, in the atomic oscillator 200 according to the modification example of the present embodiment, differences from the example of the atomic oscillator 100 according to the above-described present embodiment will be described, and description of similar points will be omitted.

The atomic oscillator 200 differs from the above-described atomic oscillator 100 in that it includes a temperature detection element 42, as shown in FIGS. 16 and 17.

The temperature detection element 42 detects the temperature of the light emitting element 10. In the example shown in FIG. 17, the temperature detection element 42 is provided on the substrate 36a of the temperature control element 36. In this case, the temperature detection element 42 indirectly detects the temperature of the light emitting element 10 by detecting the temperature of the substrate 36a. The temperature detection element 42 is, for example, a thermistor or the like.

The temperature control circuit 32 uses an output of the temperature detection element 42 to control the temperature of the light emitting element 10 to a temperature at which the light emitting element 10 emits a light of a wavelength used for detection of the EIT signal.

In the atomic oscillator 200, the temperature of the light emitting element 10 is controlled such that the center frequency $f_0$ of the emitted light from the light emitting element 10 is stabilized at a desired frequency by a first feedback loop passing through the light emitting element 10, the atomic cell 12, the light detection element 14, the current-voltage conversion circuit 16, the second wave detection circuit 30, the temperature control circuit 32, and the temperature control element 36, and by a third feedback loop passing through the light emitting element 10, the temperature detection element 42, the temperature control circuit 32, and the temperature control element 36.

A speed at which the temperature control circuit 32 controls the temperature control element 36 based on the output of the temperature detection element 42 is higher than a speed at which the temperature control circuit 32 controls the temperature control element 36 based on the wave detection signal output from the second wave detection circuit 30. That is, a speed of the third feedback loop is higher than a speed of the first feedback loop. Therefore, as shown in FIG. 18, assuming that the horizontal axis is the frequency of a signal propagating the feedback loop and the vertical axis is a gain of the loop, a gain of the third feedback loop becomes larger than a gain of the first feedback loop.

Figure 18:
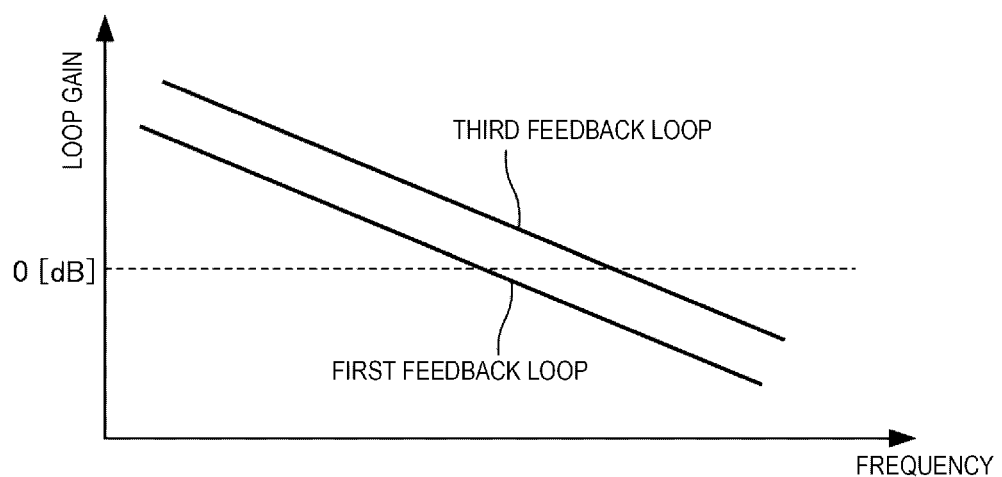
FIG. 18 is a graph for explaining a result of measuring a gain of a feedback loop using a frequency characteristic analyzer.

Note that FIG. 18 is a graph for explaining a result of measuring a gain of a feedback loop using a frequency response analyzer (FRA). By using the FRA, the magnitude correlation between the speed of the first feedback loop and the speed of the third feedback loop can be known.

The temperature control circuit 32 controls the temperature control element 36 based on the detection signal of the second wave detection circuit 30 so that the temperature of the light emitting element 10 becomes a specified temperature, for example, 35° C. It is assumed that the temperature of the light emitting element 10 deviates from 35° C. due to a disturbance while the atomic oscillator 200 is in operation. Although the temperature of the light emitting element 10 can be returned to 35° C. by the first feedback loop without having the temperature detection element 42, in the atomic oscillator 200, by having the temperature detection element 42, the temperature of the light emitting element 10 can be returned to 35° C. faster by the third feedback loop. Therefore, the atomic oscillator 200 can have higher frequency stability as compared with a case where the temperature detection element 42 is not provided.

Figure 19:
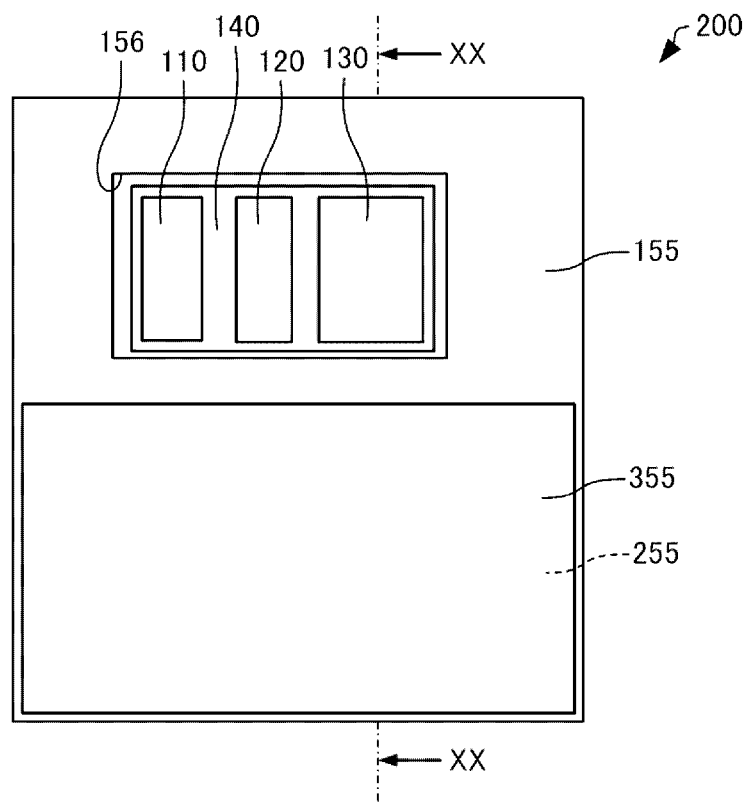
FIG. 19 is a plan view schematically showing the atomic oscillator according to the modification example of the embodiment.
Figure 20:
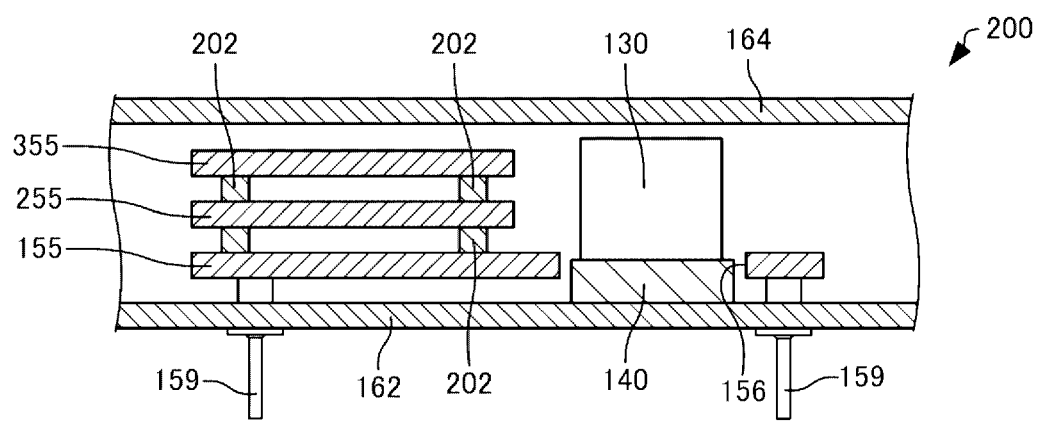
FIG. 20 is a cross-sectional view schematically showing the atomic oscillator according to the modification example of the embodiment.

Here, FIG. 19 is a plan view schematically showing the atomic oscillator 200. FIG. 20 is a cross-sectional view taken along line XX-XX in FIG. 19 schematically showing the atomic oscillator 200. Note that for the sake of convenience, in FIG. 19, members other than circuit substrates 155, 255, and 355, the light source unit 110, the optical system unit 120, the atomic cell unit 130, and the supporting member 140 are omitted. Further, in FIGS. 19 and 20, each member is simplified and shown in the figure.

As shown in FIGS. 19 and 20, the atomic oscillator 200 has the circuit substrates 255 and 355 in addition to the circuit substrate 155. The circuit substrates 155, 255, and 355 are stacked. In the illustrated example, the circuit substrate 255 is disposed between the circuit substrate 155 and the circuit substrate 355. An IC chip (not shown) is disposed on each of the circuit substrates 155, 255, and 355, and the IC chips are electrically connected to each other by a connector 202. The material of the connector 202 is, for example, gold, aluminum, copper or the like.

The IC chip of the circuit substrate 155 functions as, for example, an analog circuit such as the first wave detection circuit 18 or the second wave detection circuit 30. The IC chip of the circuit substrate 255 functions as, for example, the temperature control circuit 32. The IC chip of the circuit substrate 355 functions as a logic circuit. As described above, in the atomic oscillator 200, since the analog circuit and the temperature control circuit 32, through which a current larger than that of the analog circuit flows, are mounted on different substrates, a mutual interference between the analog circuit and the temperature control circuit can be reduced. In other words, since the first feedback loop having different current magnitude is formed across the circuit substrate 155 and the circuit substrate 355, a mutual interference between the analog circuit and the temperature control circuit can be reduced. Thereby, for example, a minute EIT signal can be detected more reliably.

3. Frequency Signal Generation System

Figure 21:
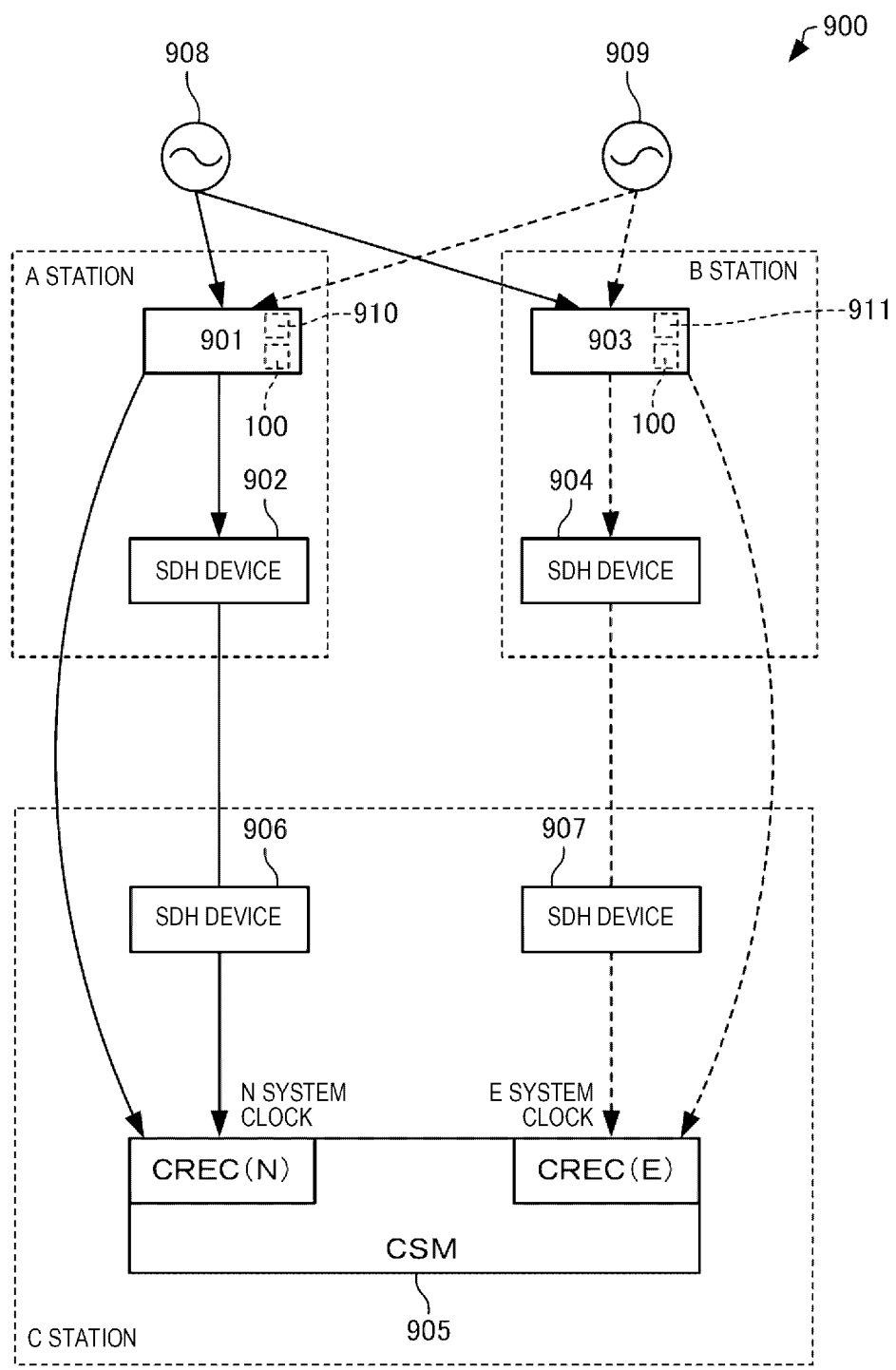
FIG. 21 is a schematic configuration view showing a frequency signal generation system according to the embodiment.

Next, a frequency signal generation system according to the present embodiment will be described with reference to the drawings. The following clock transmission system as a timing server is an example of a frequency signal generation system. FIG. 21 is a schematic configuration diagram showing a clock transmission system 900.

The clock transmission system according to the present embodiment includes the atomic oscillator according to the above embodiment. In the following, the clock transmission system 900 including the atomic oscillator 100 will be described as an example.

The clock transmission system 900 is to synchronize a clock of each device in a time division multiplexing network, and is a system having a redundant configuration of a normal (N) system and an emergency (E) system.

As shown in FIG. 21, the clock transmission system 900 includes a clock supply device 901 and a synchronous digital hierarchy (SDH) device 902 of an A station (upper level (N system)), a clock supply device 903 and an SDH device 904 of a B station (upper level (E system)), and a clock supply device 905 and SDH devices 906 and 907 of a C station (lower level). The clock supply device 901 has the atomic oscillator 100 and generates an N system clock signal. The clock supply device 901 has a terminal 910 to which a frequency signal from the atomic oscillator 100 is input. The atomic oscillator 100 in the clock supply device 901 generates a clock signal in synchronization with a more accurate clock signal from master clocks 908 and 909 including the atomic oscillator using a cesium.

Based on the clock signal from the clock supply device 901, the SDH device 902 transmits and receives a main signal, superimposes the N system clock signal on the main signal, and transmits the signal to the lower level clock supply device 905. The clock supply device 903 has the atomic oscillator 100 and generates an E system clock signal. The clock supply device 903 has a terminal 911 to which a frequency signal from the atomic oscillator 100 is input. The atomic oscillator 100 in the clock supply device 903 generates a clock signal in synchronization with a more accurate clock signal from the master clocks 908 and 909 including the atomic oscillator using a cesium.

Based on the clock signal from the clock supply device 903, the SDH device 904 transmits and receives a main signal, superimposes the E system clock signal on the main signal, and transmits the signal to the lower level clock supply device 905. The clock supply device 905 receives the clock signal from the clock supply devices 901 and 903, and generates a clock signal in synchronization with the received clock signal.

The clock supply device 905 normally generates a clock signal in synchronization with the N system clock signal from the clock supply device 901. Then, when an abnormality occurs in the N system, the clock supply device 905 generates a clock signal in synchronization with the E system clock signal from the clock supply device 903. By switching from the N system to the E system like this, a stable clock supply can be guaranteed, and the reliability of the clock path network can be enhanced. The SDH device 906 transmits and receives the main signal based on the clock signal from the clock supply device 905. Similarly, the SDH device 907 transmits and receives the main signal based on the clock signal from the clock supply device 905. In this way, it is possible to synchronize the device of the C station with the device of the A station or the B station.

The frequency signal generation system according to the present embodiment is not limited to the clock transmission system. The frequency signal generation system is equipped with the atomic oscillator, and includes various devices using the frequency signal of the atomic oscillator and a system configured with a plurality of devices. The frequency signal generation system includes a controller that controls the atomic oscillator.

The frequency signal generation system according to the present embodiment may be, for example, a smart phone, a tablet terminal, a timepiece, a portable phone, a digital still camera, a liquid ejecting apparatus such as an ink jet printer, a personal computer, a television, a video camera, a video tape recorder, a car navigation device, a pager, an electronic notebook, an electronic dictionary, a calculator, an electronic game machine, a word processor, a workstation, a video phone, a security television monitor, an electronic binoculars, a point of sales (POS) terminal, a medical machine, a fish finder, a global navigation satellite system (GNSS) frequency standard, various measuring machines, instruments, a flight simulator, a terrestrial digital broadcasting system, a portable phone base station, and a moving object.

Examples of the medical machine include, for example, an electronic clinical thermometer, a blood pressure manometer, a blood glucose meter, an electrocardiogram measurement device, an ultrasonic diagnostic device, an electronic endoscope, and a magnetocardiography. Examples of the instruments include, for example, instruments such as a vehicle, an aircraft, a ship. Examples of the moving object include, for example, a vehicle, an aircraft, a ship, or the like.

The present disclosure may omit a part of the configuration within a range having the features and effects described in this application, or combine each embodiment and modification.

The present disclosure includes a configuration (for example, a configuration having the same function, a method, and a result, or a configuration having the same object and effect) that is substantially the same as the configuration described in the embodiment. Further, the present disclosure includes a configuration in which non-essential parts of the configuration described in the embodiments are replaced. Further, the present disclosure includes a configuration that achieves the same operation and effect as the configuration described in the embodiments, or a configuration that can achieve the same object. Further, the present disclosure includes a configuration in which a known technique is added to the configuration described in the embodiments.

What is claimed is:

1. An atomic oscillator comprising:
    a light emitting element;
    a temperature control element that controls a temperature of the light emitting element;
    an atomic cell which is irradiated with a light from the light emitting element and in which an alkali metal atom is contained;
    a light detection element that detects a light transmitted through the atomic cell;
    an oscillator that outputs an oscillation signal;
    a wave detection circuit that detects a wave of a signal, which is based on an output of the light detection element, using the oscillation signal, and outputs a wave detection signal;
    a temperature control circuit that controls the temperature control element based on the wave detection signal; and
    a drive circuit that includes a constant current circuit generating a current of a specified value for driving the light emitting element and superimposes a modulation current, which is based on the oscillation signal, on the current to output a drive current to the light emitting element, wherein
    the wave detection signal is not input to the constant current circuit.

2. The atomic oscillator according to claim 1, wherein the temperature control circuit controls the temperature of the light emitting element to a temperature at which the light emitting element emits a light of a wavelength used for a detection of an electromagnetically induced transparency (EIT) signal.

3. The atomic oscillator according to claim 2, further comprising:
    a temperature detection element that detects the temperature of the light emitting element, wherein
    the temperature control circuit controls the temperature of the light emitting element to the temperature at which the light emitting element emits a light of a wavelength used for the detection of the EIT signal using an output of the temperature detection element.

4. The atomic oscillator according to claim 3, wherein a speed at which the temperature control circuit controls the temperature control element based on the output of the temperature detection element, is higher than a speed at which the temperature control circuit controls the temperature control element based on the wave detection signal.

5. A frequency signal generation system comprising:
    an atomic oscillator; and a terminal to which a frequency signal from the atomic oscillator is input, wherein
the atomic oscillator includes
  a light emitting element,
  a temperature control element that controls a temperature of the light emitting element,
  an atomic cell which is irradiated with a light from the light emitting element and in which an alkali metal atom is contained,
  a light detection element that detects a light transmitted through the atomic cell,
  an oscillator that outputs an oscillation signal,
  a wave detection circuit that detects a wave of a signal, which is based on an output of the light detection element, using the oscillation signal of the oscillator, and outputs a wave detection signal,
  a temperature control circuit that controls the temperature control element based on the wave detection signal, and
  a drive circuit that includes a constant current circuit generating a current of a specified value for driving the light emitting element and superimposes a modulation current, which is based on the oscillation signal of the oscillator, on the current to output a drive current to the light emitting element; and
wherein the wave detection signal is not input to the constant cur rent circuit.

* * * * *